(12) United States Patent
Walther et al.

(10) Patent No.: US 10,129,676 B2
(45) Date of Patent: Nov. 13, 2018

(54) MEMS MICROPHONE, APPARATUS COMPRISING A MEMS MICROPHONE AND METHOD FOR FABRICATING A MEMS MICROPHONE

(71) Applicant: Infineon Technologies AG, Neubiberg (DE)

(72) Inventors: Arnaud Walther, Unterhaching (DE); Alfons Dehe, Reutlingen (DE)

(73) Assignee: Infineon Technologies AG, Neubiberg (DE)

( * ) Notice: Subject to any disclaimer, the term of this patent is extended or adjusted under 35 U.S.C. 154(b) by 226 days.

(21) Appl. No.: 15/044,663

(22) Filed: Feb. 16, 2016

(65) Prior Publication Data

US 2017/0238107 A1  Aug. 17, 2017

(51) Int. Cl.
| | |
|---|---|
| *H04R 29/00* | (2006.01) |
| *B81C 1/00* | (2006.01) |
| *G01K 7/02* | (2006.01) |
| *H04R 3/00* | (2006.01) |
| *H04R 19/00* | (2006.01) |
| *H04R 19/04* | (2006.01) |
| *B81B 7/02* | (2006.01) |

(Continued)

(52) U.S. Cl.
CPC .............. *H04R 29/004* (2013.01); *B81B 7/02* (2013.01); *B81C 1/00158* (2013.01); *G01K 1/14* (2013.01); *G01K 7/02* (2013.01); *G01K 7/028* (2013.01); *H04R 3/00* (2013.01); *H04R 19/005* (2013.01); *H04R 19/04* (2013.01); *B81B 2201/0257* (2013.01); *B81B 2201/0278* (2013.01); *H04R 7/10* (2013.01); *H04R 2307/027* (2013.01); *H04R 2499/11* (2013.01)

(58) Field of Classification Search
CPC ........ H04R 19/04; H04R 31/00; H04R 7/122; H04R 3/00; H04R 19/005; H04R 31/003; H04R 2207/00; B81C 1/00158; B81C 2201/013; B81B 3/0021; B81B 2203/0127; B81B 2203/04; B81B 2201/0257

See application file for complete search history.

(56) References Cited

U.S. PATENT DOCUMENTS

| | | | | |
|---|---|---|---|---|
| 4,420,727 A | * | 12/1983 | Rau .......................... | G01D 5/48 307/652 |
| 5,589,689 A | * | 12/1996 | Koskinen .................. | G01J 3/26 250/338.1 |

(Continued)

FOREIGN PATENT DOCUMENTS

| | | | |
|---|---|---|---|
| DE | 102008002157 A1 | 12/2009 | |
| KR | 101234990 B1 * | 2/2013 | ............. G01D 21/02 |

OTHER PUBLICATIONS

Akin, T., "CMOS-based Thermal Sensors," Advanced Micro and Nanosystems. vol. 2. CMOS—MEMS, Feb. 29, 2008, pp. 479-512.

(Continued)

*Primary Examiner* — Oyesola C Ojo
(74) *Attorney, Agent, or Firm* — Slater Matsil, LLP

(57) ABSTRACT

A MEMS microphone and a method for manufacturing a MEMS microphone are disclosed. Embodiments of the invention provide a MEMS microphone including a MEMS microphone structure having at least one counter electrode structure and a diaphragm structure deflectable with respect to the counter electrode structure and a thermocouple arranged at the MEMS microphone structure.

32 Claims, 15 Drawing Sheets

(51) Int. Cl.
 *G01K 1/14* (2006.01)
 *H04R 7/10* (2006.01)

(56) References Cited

U.S. PATENT DOCUMENTS

| | | | | | |
|---|---|---|---|---|---|
| 6,305,840 | B1* | 10/2001 | Kim | ................ | G01J 5/12 136/225 |
| 6,521,313 | B1* | 2/2003 | Artmann | ............... | B81B 3/0081 216/2 |
| 9,638,598 | B2* | 5/2017 | Fehrenbach | ............ | G01L 9/125 |
| 2003/0110867 | A1* | 6/2003 | Artmann | ............... | B81C 1/0069 73/861.08 |
| 2005/0011260 | A1* | 1/2005 | Arndt | .................... | G01P 15/008 73/204.26 |
| 2005/0060884 | A1* | 3/2005 | Okamura | ................ | H01L 35/32 29/846 |
| 2005/0156109 | A1* | 7/2005 | Ludwig | .................... | G01J 5/10 250/338.1 |
| 2006/0075820 | A1* | 4/2006 | Cobianu | ................ | G01L 9/0025 73/703 |
| 2006/0186438 | A1* | 8/2006 | Verhaegen | ............ | G01K 7/04 257/200 |
| 2010/0195851 | A1* | 8/2010 | Buccafusca | ............ | H04R 17/02 381/190 |
| 2011/0012478 | A1* | 1/2011 | Najafi | .................. | B81C 1/0019 310/334 |
| 2012/0103379 | A1* | 5/2012 | Krinn | ..................... | H01L 35/32 136/212 |
| 2012/0132006 | A1* | 5/2012 | Roziere | .................... | G01D 5/24 73/724 |
| 2013/0322675 | A1* | 12/2013 | Zoellin | .................... | H04R 1/04 381/355 |
| 2014/0112510 | A1* | 4/2014 | Yang | ...................... | H04R 1/021 381/332 |
| 2014/0169405 | A1* | 6/2014 | Graham | ................ | G01K 7/226 374/185 |
| 2015/0001647 | A1 | 1/2015 | Dehe et al. | | |
| 2015/0129992 | A1* | 5/2015 | Hur | ....................... | H04R 19/04 257/416 |
| 2015/0321906 | A1* | 11/2015 | Tsai | ......................... | B81B 7/02 257/416 |
| 2016/0165330 | A1* | 6/2016 | Minervini | ............. | G01K 13/00 374/142 |
| 2016/0221822 | A1* | 8/2016 | Krumbein | ............. | H04R 23/00 |
| 2016/0320256 | A1* | 11/2016 | Burgard | ............. | G01L 9/0072 |
| 2017/0026730 | A1* | 1/2017 | Albers | ..................... | G01K 1/14 |

OTHER PUBLICATIONS

Oudheusden, B.&W., "Silicon thermal flow sensors", Sensors and Actuators A: Physical, vol. 30, issues 1-2, Jan. 1992; pp. 5-26.

\* cited by examiner

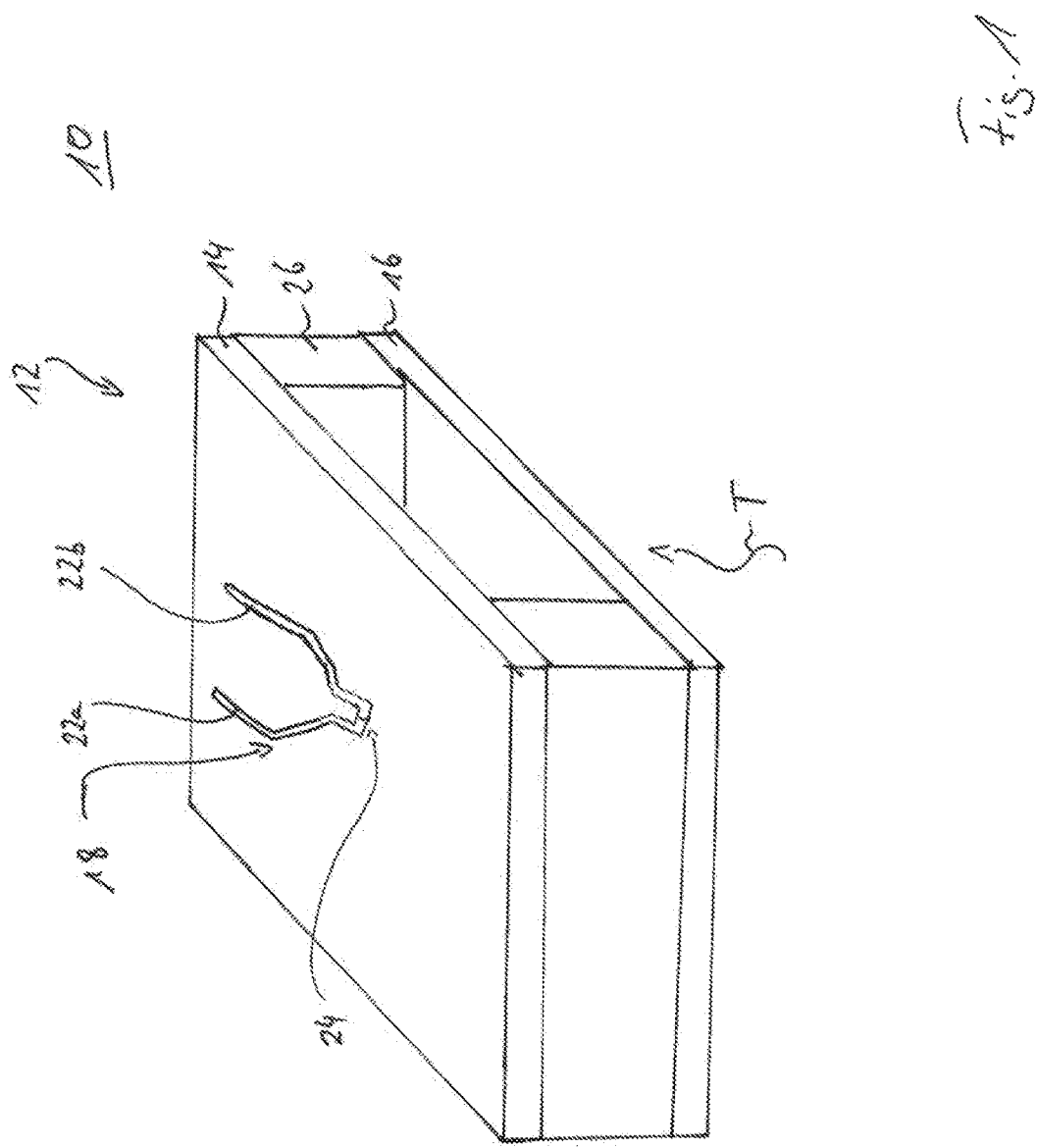

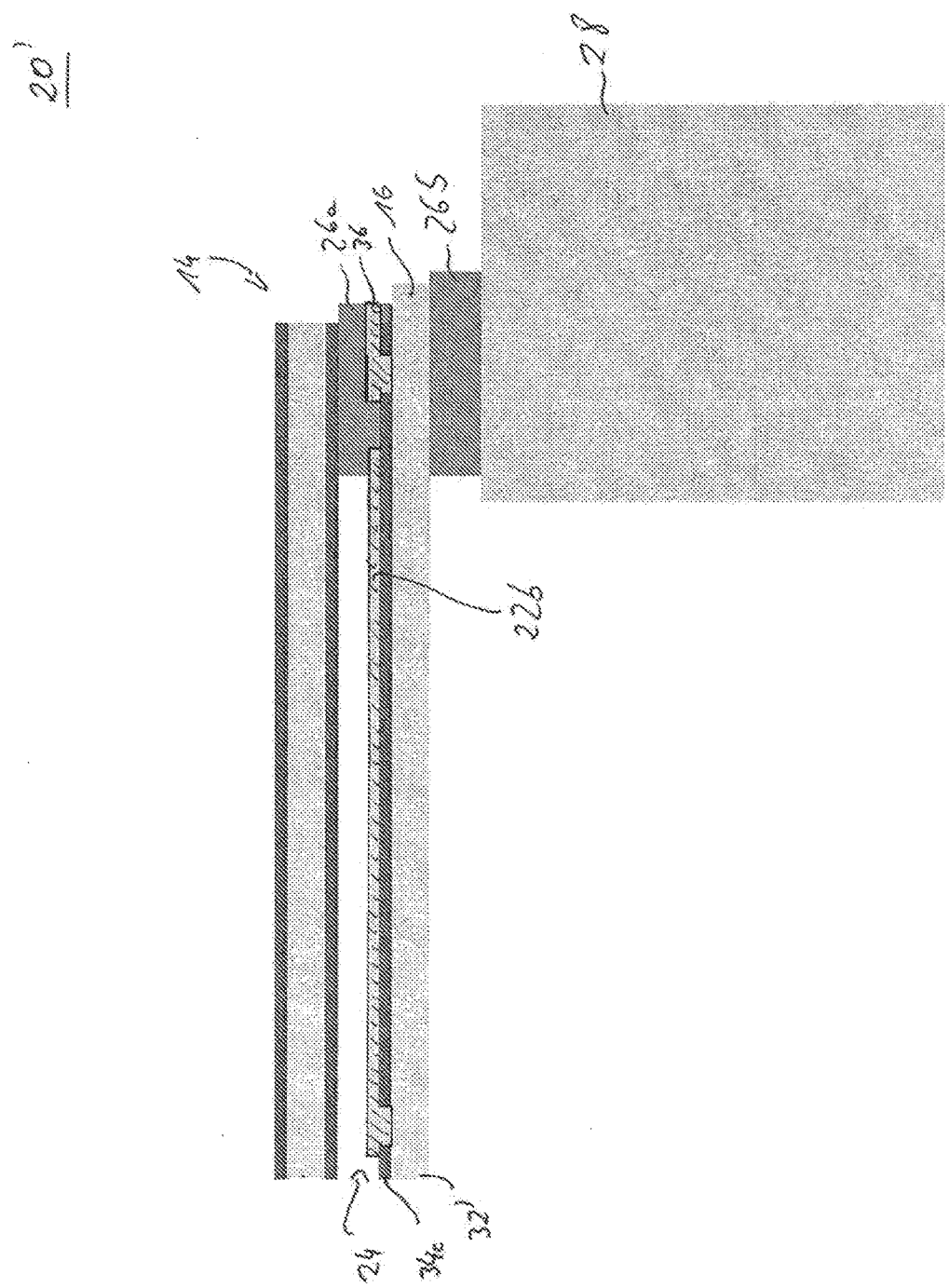

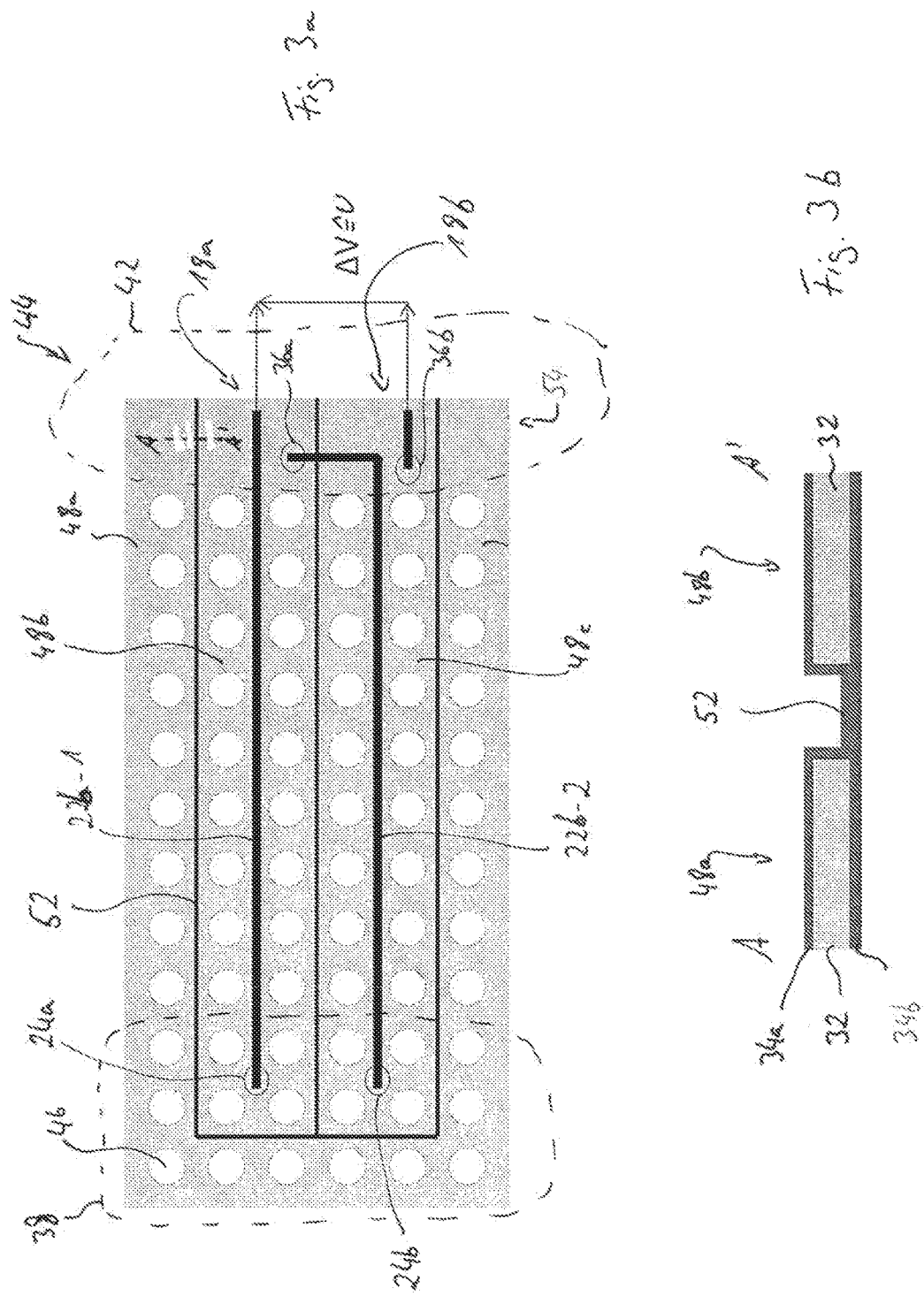

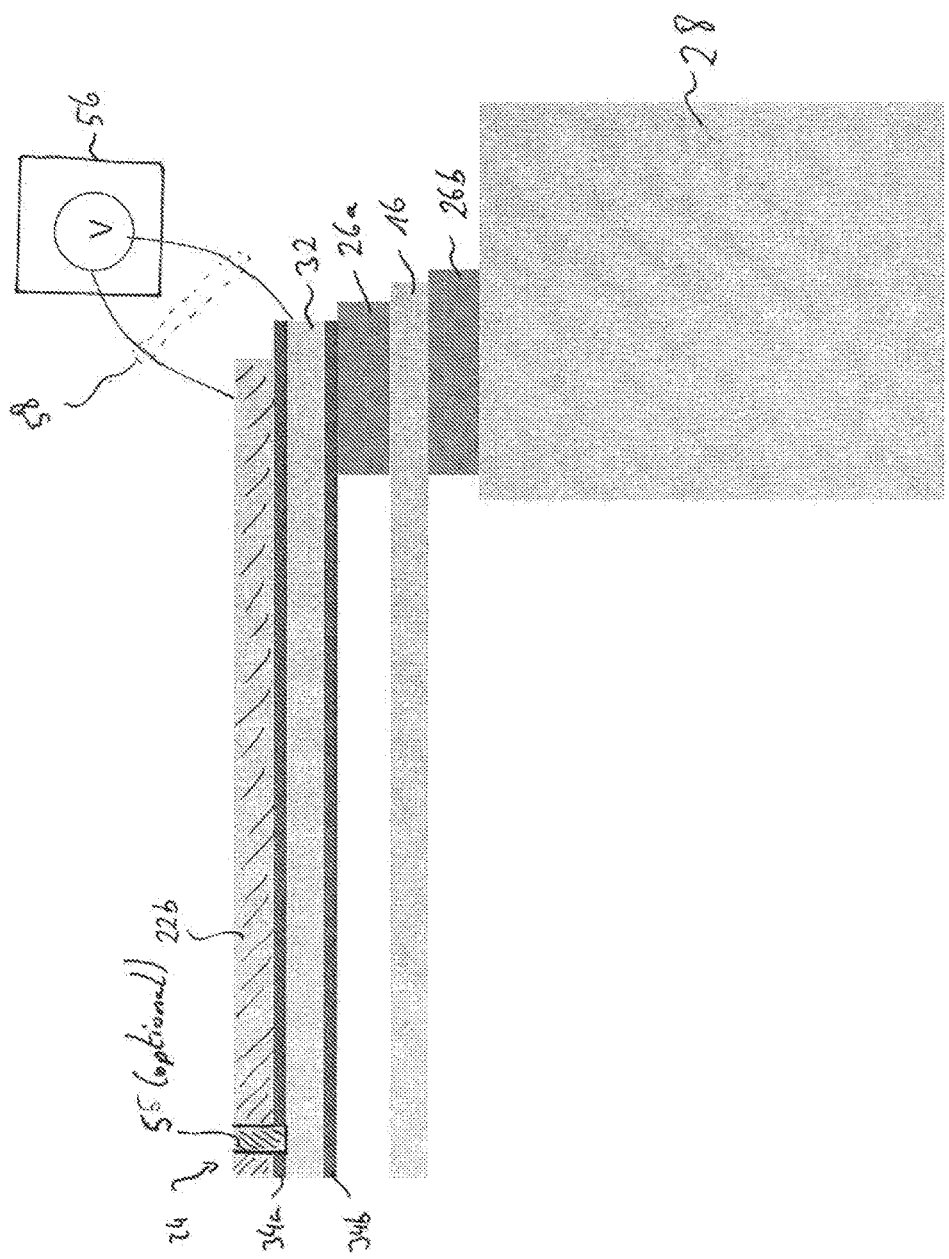

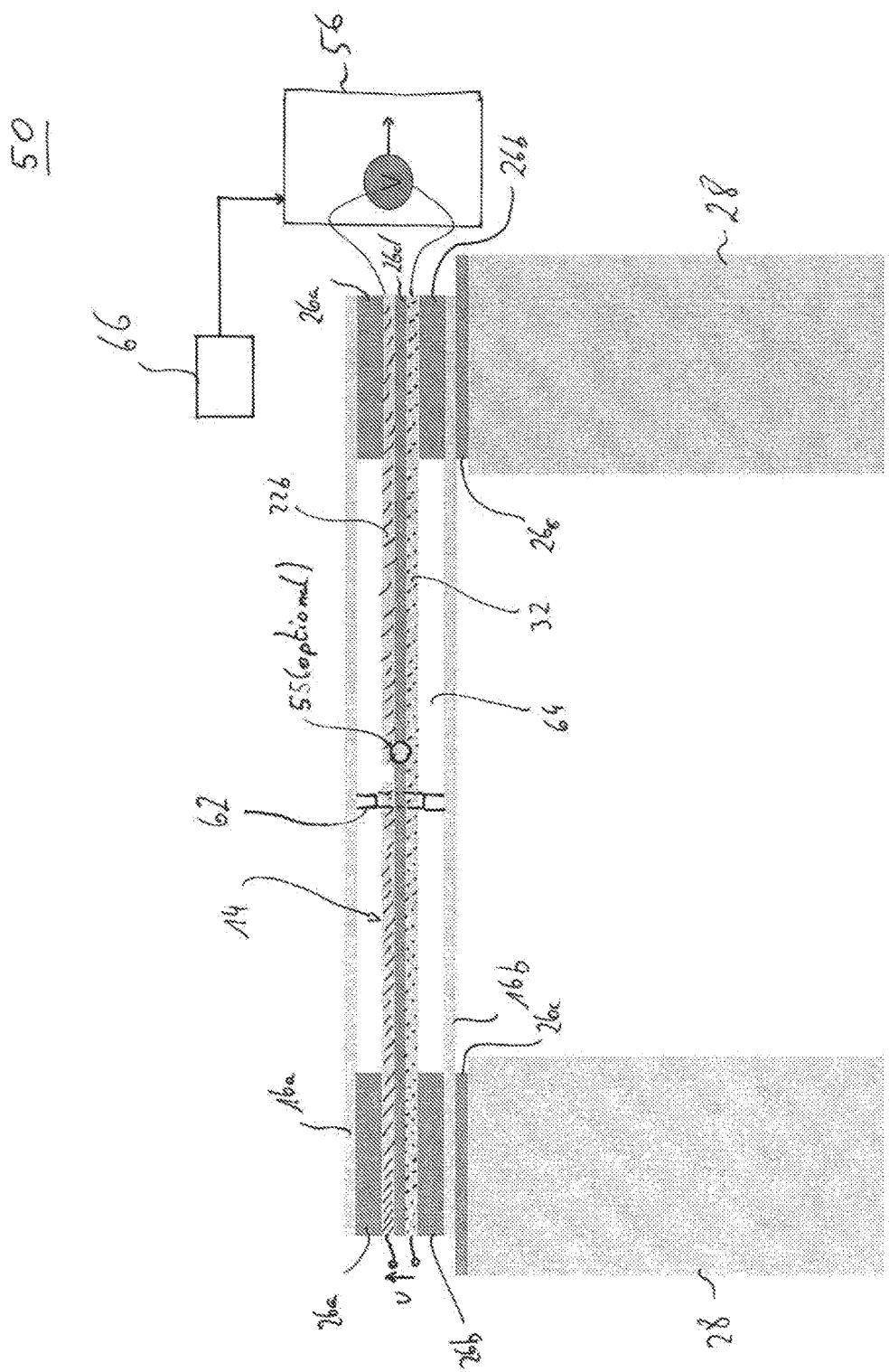

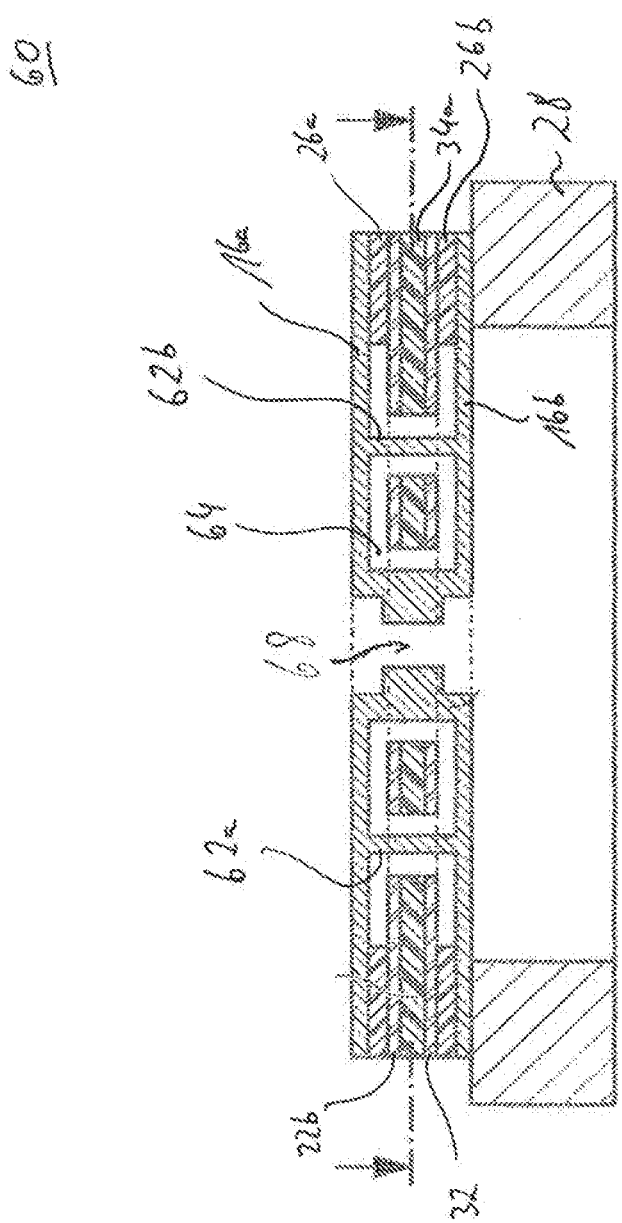

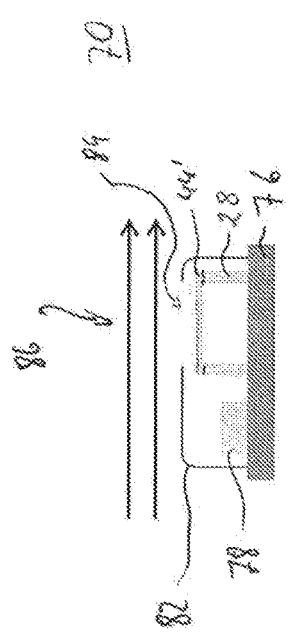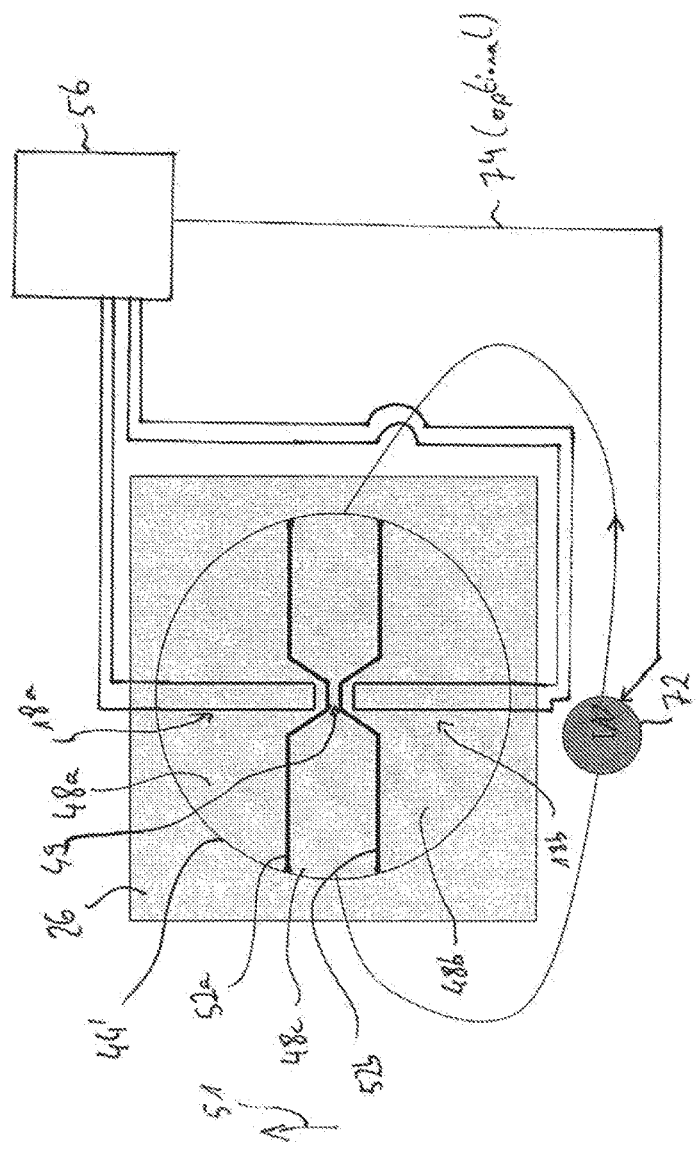
Fig. 7b
Fig. 7a

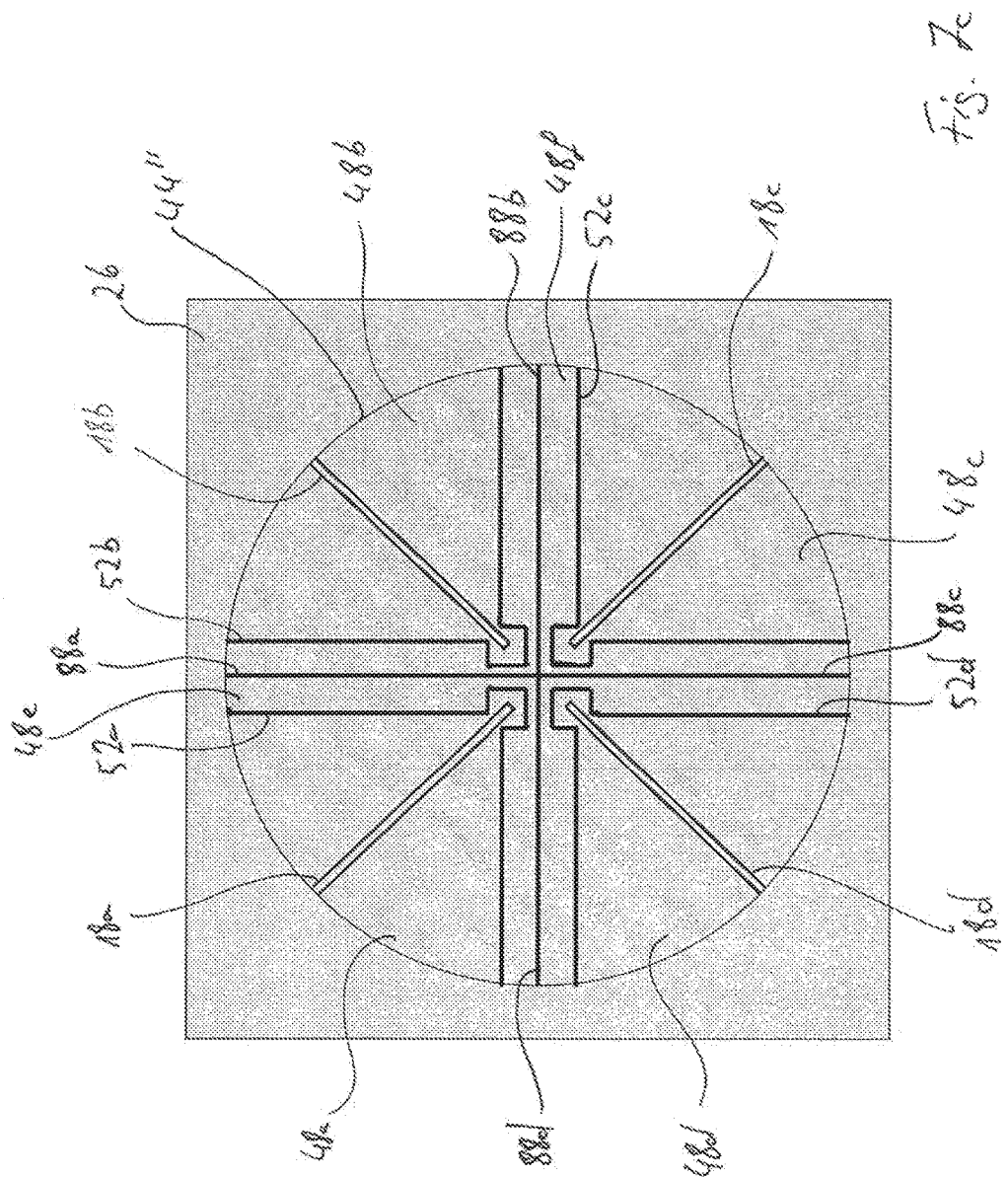

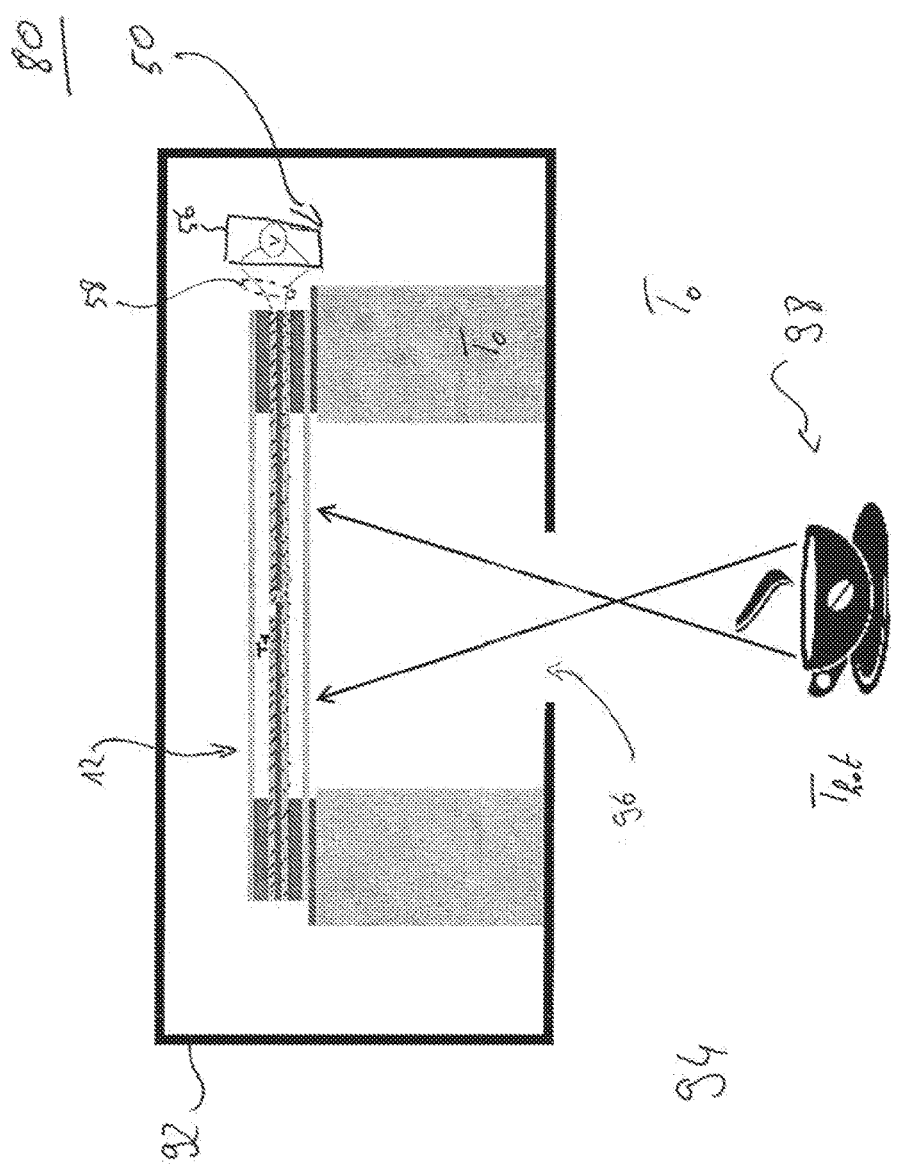

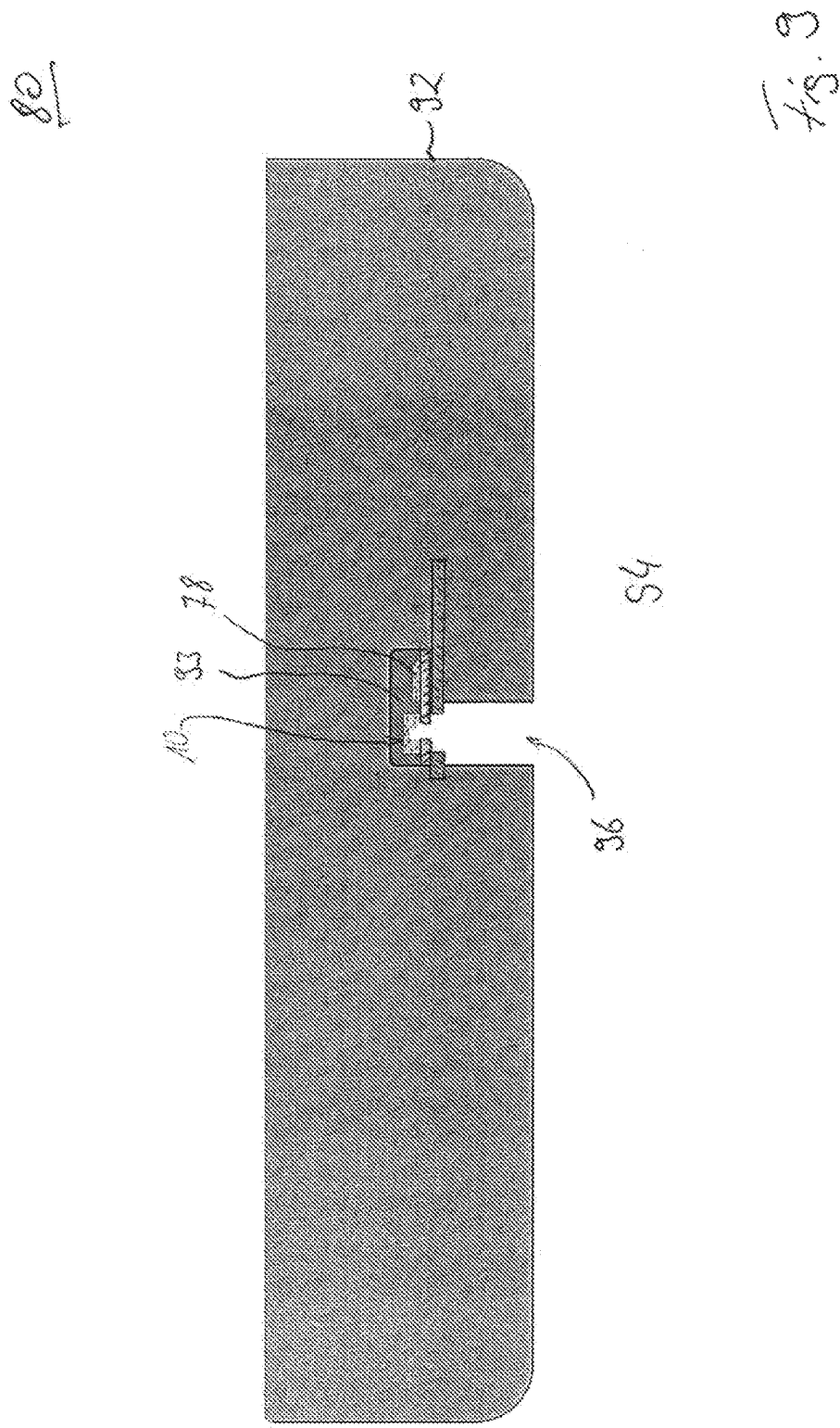

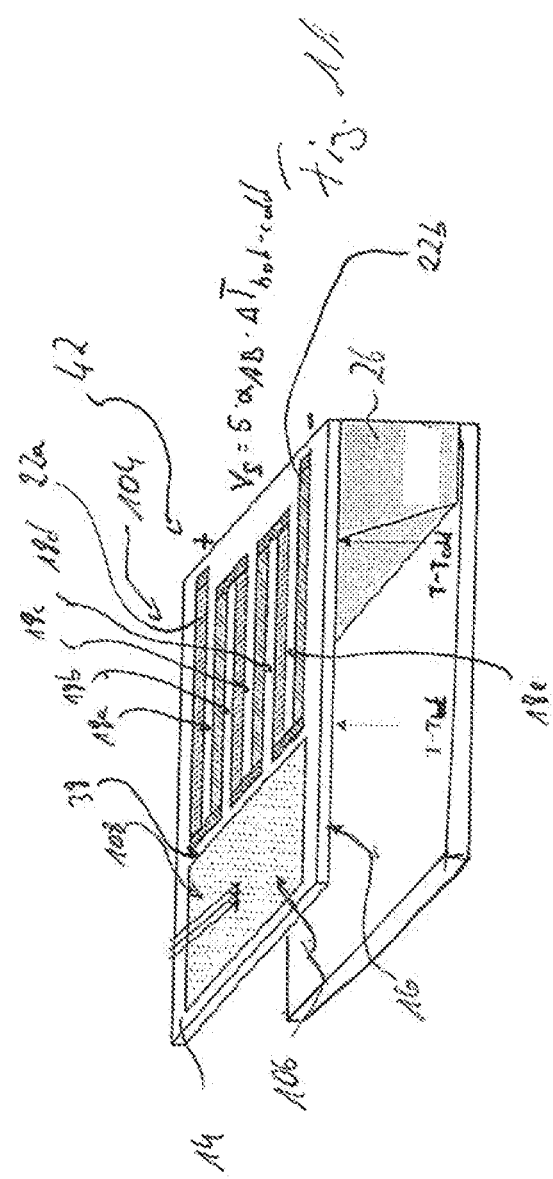

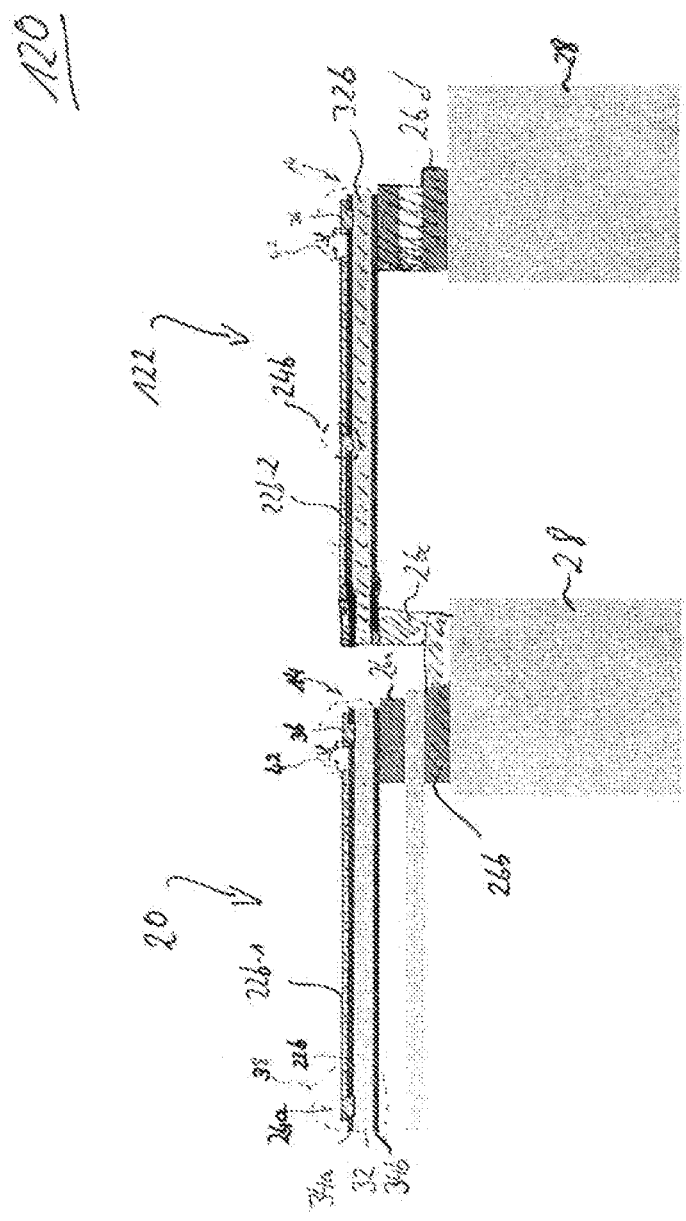

```
                          1300
    ┌─────────────────────────────────────┐
    │  Providing a MEMS microphone        │
    │  structure having a counter         │
    │  electrode and a diaphragm          │─ 1310
    │  structure deflectable with         │
    │  respect to the counter             │
    │  electrode structure                │
    └─────────────────┬───────────────────┘
                      │
    ┌─────────────────┴───────────────────┐
    │  Forming a thermocouple at the MEMS │─ 1320
    │  microphone structure               │
    └─────────────────────────────────────┘
```

Fig. 13

MEMS MICROPHONE, APPARATUS COMPRISING A MEMS MICROPHONE AND METHOD FOR FABRICATING A MEMS MICROPHONE

TECHNICAL FIELD

The invention relates to MEMS microphones. The invention further relates to an apparatus comprising a MEMS microphone and to methods for fabricating a MEMS microphone. The invention also relates to a microphone with integrated temperature sensor and to a microphone with integrated thermocouple sensors.

BACKGROUND

The term microelectromechanical system (MEMS) is often used to refer to small integrated devices or systems that combine electrical and mechanical components. Microphones may be implemented as MEMS, i.e., small microphones comprising mechanical components such as membranes and electrical components for measuring sound pressure levels.

MEMS microphones may be part of an application-specific integrated circuit (ASIC) or may be connected thereto.

SUMMARY

The inventors have found that measurement of a temperature of a MEMS microphone or at a region close thereto may be performed with high precision when arranging a thermocouple acting as temperature sensor at a MEMS microphone structure, for example, a counter electrode structure and/or a diaphragm structure. This allows for measuring a temperature at parts of the MEMS microphone that are exposed to the temperature to be measured. The measurement may be more precise when compared to a measurement of the temperature at an application specific integrated circuit (ASIC) connected to the microphone and arranged apart from the microphone structure itself.

Embodiments provide a MEMS microphone comprising a MEMS microphone structure having at least one counter electrode and a diaphragm structure deflectable with respect to the counter electrode structure. The MEMS microphone comprises a thermocouple being arranged at the MEMS microphone structure. A thermocouple may thus be arranged at the counter electrode and/or at the diaphragm structure.

Other embodiments provide an apparatus comprising a housing and a MEMS microphone arranged inside the housing and connected to an outer volume of the housing through a sound port. The MEMS microphone comprises a MEMS microphone structure having a counter electrode and a diaphragm structure deflectable with respect to the counter electrode structure. The MEMS microphone further comprises a thermocouple being arranged at the MEMS microphone structure. The temperature of the outer volume of the housing of the apparatus may act directly, for example through air, or indirectly, for example through infrared radiation, on the thermocouple. The temperature of the outer volume may be sensed or determined with high precision as falsification of the measurement by the housing, which may block or absorb infrared radiation or ambient air, is prevented or reduced.

Yet further embodiments provide a method for fabricating a MEMS microphone. The method comprises providing a MEMS microphone structure having a counter electrode and a diaphragm structure deflectable with respect to the counter electrode structure. The method further comprises forming a thermocouple at the MEMS microphone structure.

Various embodiments of the present invention are described herein making reference to the appended drawings.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 shows a schematic perspective view of a MEMS microphone comprising a MEMS microphone structure according to an embodiment;

FIG. 2b shows a schematic side view of another MEMS microphone according to an embodiment, wherein a thermocouple is arranged at the diaphragm structure;

FIG. 3a shows a schematic top view of a measuring structure which may be arranged as counter electrode structure and/or as diaphragm structure in MEMS microphones according to embodiments described herein;

FIG. 3b shows a schematic side view of a cut of the measurement structure illustrated in FIG. 3a;

FIG. 4 shows a schematic side view of a further MEMS microphone according to an embodiment;

FIG. 5 shows a schematic side view of a MEMS microphone according to an embodiment, which may be used as a bolometer;

FIG. 6 shows a schematic side view of a MEMS microphone in accordance with embodiments described herein, having a counter electrode structure arranged between two diaphragm structures;

FIG. 7a shows a schematic top view of another measuring structure which may be part of a MEMS microphone in accordance with embodiments described herein;

FIG. 7b shows a schematic side view of a MEMS microphone in accordance with embodiments described herein and being exposed to an air flow;

FIG. 7c shows a schematic top view of another measuring structure comprising four quadrants of a measurement region, which may be arranged at MEMS microphones in accordance with embodiments described herein;

FIG. 8 shows a schematic side view of an apparatus in accordance with embodiment described herein, comprising the MEMS microphone described in FIG. 5 being arranged inside a housing;

FIG. 9 shows a schematic side view of a section of the apparatus illustrated in FIG. 8;

FIG. 11 shows the configuration of a thermopile being arranged at a counter electrode structure according to an embodiment;

FIG. 12 shows a schematic arrangement of a further temperature sensor according to an embodiment; and FIG. 13 shows a schematic flow chart of a method for fabricating a MEMS microphone according to an embodiment.

DETAILED DESCRIPTION OF ILLUSTRATIVE EMBODIMENTS

Figure 2A:
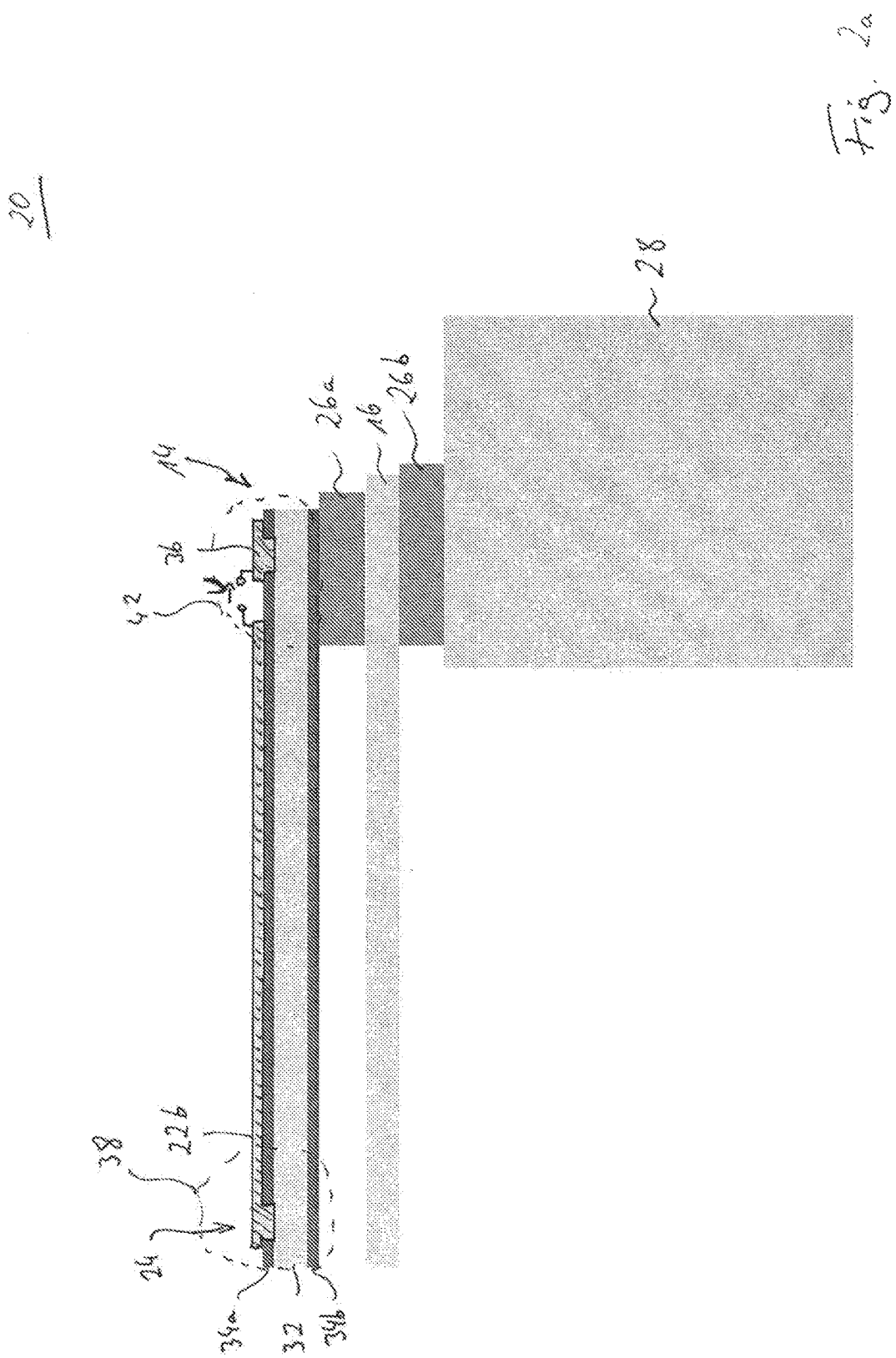
FIG. 2a shows a schematic side view of a MEMS microphone according to an embodiment, comprising the MEMS microphone structure having a counter electrode structure and the diaphragm structure.

Before embodiments of the present invention will be described in detail using the accompanying figures, it is to be pointed out that the same or functionally equal elements are given the same reference numbers in the figures and that a repeated description for elements provided with the same or similar reference numbers is typically omitted. Hence, descriptions provided for elements having the same reference numbers are mutually exchangeable and applicable.

MEMS microphones (MEMS=microelectromechanical system) may comprise a static portion and a defectable portion being deflectable with respect to the static portion. A conductive structure useable as an electrode may be arranged as the static portion and may be referred to as counter electrode. The counter electrode structure may also be referred to as backplate of the MEMS microphone. A further electrode may be arranged at the deflectable portion or may be a part thereof. Both electrodes and a movement therebetween may be used as a functionality of a microphone by sensing the movement. The static portion and/or the deflectable portion may comprise semiconductor materials such as silicon or poly-silicon and/or compounds comprising silicon and/or poly-silicon.

Embodiments described herein may refer to the terms diaphragm structure (membrane) and counter electrode structure (backplate). The terms membrane may be understood as a portion of the MEMS microphone being deflectable with respect to the counter electrode structure which may be a static portion of the MEMS microphone.

Although the following description refers to MEMS microphones, the description also relates to MEMS loudspeakers, which may be formed in a similar way when compared to MEMS microphones. In general, a sound transducer may be configured to operate as a microphone and/or a loudspeaker such that examples described herein may also be operated as loudspeakers. To be more precise, a MEMS microphone is configured for reacting due to varying pressures of an environment of the MEMS microphone. Usually, this is referred to as measuring a variation of a sound pressure level. Microphones may perform such measurements with a high repetition rate to enable measurement of higher frequencies of more than 1 Hz, more than 10 Hz more than 100 Hz, more than 1 kHz and/or more than 10 kHz.

Other sensors, which may be referred to as pressure sensors, may use a similar concept where a high repetition rate is sometimes not necessary. Therefore, the examples described herein may also refer to pressure sensors.

Embodiments described herein may relate to obtain a measurement signal by use of a thermocouple, the thermocouple comprising two elements having different Seebeck coefficients. Although the embodiments described herein relate to connect both elements at a so-called hot region, i.e., a region with a higher temperature, and relate to obtain the measurement signal at a so-called cold region, i.e., a region with a temperature with a lower temperature when compared to the hot region, those explanations are mutually exchangeable. For a functionality of a thermocouple used in embodiments described herein, it may be sufficient to electrically connect two materials having a different Seebeck coefficient at a first temperature level and measuring a voltage at the other end of the elements of the thermocouple. For such a measurement it may be unimportant which end, the connected or insulated, is arranged at a higher temperature or at a lower temperature.

A measurement signal obtained by use of a thermocouple may be generated by a temperature difference, i.e., a same or comparable measurement signal may be obtained when connecting the two elements at the cold region. A temperature gradient in the elements may result in a voltage gradient in each of the elements of the thermocouple, wherein based on different Seebeck coefficients different potentials may be obtained at the far ends of the elements opposing the connected ends. The different potentials may result in a measurement voltage between the far ends of the thermocouple, wherein the measurement voltage may be converted to a measurement current, for example, when using a shunt resistance. Thus, a measurement signal described herein may relate to a measurement voltage and/or to measurement current. The thermocouples described herein may be understood as self-generating elements, i.e., as generators configured for generating electrical energy using the temperature difference between the hot region and the cold region. The self-generated voltage at the open ends of the thermocouple 18 may also be referred to as a Seebeck voltage.

Different Seebeck coefficients may be obtained, for example by implementing both the first and the second elements using different materials. For example, different Seebeck coefficients may be obtained by using different metal materials. Suitable metal materials may be, for example, a copper material, an aluminum material, a silver material, a gold material, an iron material and/or alloys thereof. A semiconductor material, for example, a silicon or poly-silicon material, may be doped to obtain an electrical conductive material. By using different doping materials such as, for example, phosphorous, boron, arsenic or aluminum and/or by using different doping concentrations thereof, different Seebeck coefficients may be obtained. Both elements may be formed by same or different materials. For example, the elements may each be formed by a metal material or a semiconductor material. Alternatively, one element may comprise a semiconductor material, wherein the other element comprises a metal material.

FIG. 1 shows a schematic perspective view of a MEMS microphone 10 comprising a MEMS microphone structure 12. The MEMS microphone structure 12 comprises a counter electrode structure 14 and a diaphragm structure 16. The diaphragm structure 16 is deflectable with respect to the counter electrode structure 14. The MEMS microphone 10 comprises a thermocouple 18 being arranged at the counter electrode structure 14. The first element 22a may comprise a first Seebeck coefficient. The second element 22b may comprise a second, different Seebeck coefficient. The first element 22a and the second element 22b may be electrically connected to each other at a contacting portion 24.

A temperature acting on the MEMS microphone 10 may result in a so-called hot region and a so-called cold region. The hot region may be understood as a region of the thermocouple 18 which is warmed by a higher degree when compared to the cold region based on the temperature T, a temperature difference between an outer volume of the microphone and a place of the MEMS microphone or based on a thermal radiation (infrared radiation). For example, the cold region may be an outer region or a circumferential region of the diaphragm structure 16 which is hinged or connected to a spacing structure or a substrate which may act as a heat sink.

Thus, between the hot region and the cold region there may be a temperature gradient. The temperature gradient may also be present in the first element 22a and the second element 22b, wherein based on the different Seebeck coefficients a different electrical potential may be obtained in each of the first element 22a and the second element 22b resulting in a measureable electrical voltage between the first element 22a and the second element 22b in the cold region.

A spacing material 26 may be arranged between the counter electrode structure 14 and the diaphragm structure 16 so as to provide a distance between the counter electrode structure 14 and the diaphragm structure 16 so that the diaphragm structure 16 is deflectable with respect to the counter electrode 14. The cold region may be adjacent to the spacing material 26, wherein the hot region may be spaced apart from the cold region. The spacing material may be any material, for example, a metal material, a semiconductor material, a doped semiconductor material and/or an oxide material. Electrically insulating materials such as oxide materials may provide for an electrical insulation between the counter electrode structure 14 and the membrane structure 16 to prevent short circuits between both electrodes.

Although the thermocouple is shown as being arranged at the counter electrode structure 14, according to other embodiments, the thermocouple 18 may be arranged at the membrane structure 16.

Arranging the thermocouple 18 at the diaphragm structure 16 may allow for measuring the temperature T directly, i.e. without any other materials between the environment and the diaphragm structure 16. Arranging the thermocouple 18 at the counter electrode structure 14 may allow for an increased robustness of the MEMS microphone 10 as deformation of the thermocouple 18 during operation of the MEMS microphone 10 may be reduced or prevented.

When mounting the MEMS microphone 10 into a system, the MEMS microphone may be arranged such that the diaphragm structure 16 faces an outer volume of the system. This may allow for a high sensitivity of the MEMS microphone. Alternatively, the MEMS microphone may be mounted such that the counter electrode structure 14 faces the outer volume, i.e., the diaphragm structure 16 is shielded by the counter electrode structure 14. The counter electrode structure 14 may comprise holes so as to allow for a more sensitive measurement and/or may allow to protect the diaphragm structure from damage. For example, the counter electrode structure may be at least partially transparent to thermal radiation allowing to measure the temperature T by measuring, for example, the thermal radiation as will be described later in more detail. Thus, embodiments described herein may be mounted in either configuration, the MEMS diaphragm structure 16 facing the outer volume or the counter electrode structure 14 facing the outer volume.

FIG. 2a shows a schematic side view of a MEMS microphone 20. The MEMS microphone 20 may comprise the MEMS microphone structure having the counter electrode structure 14 and the diaphragm structure 16. The MEMS microphone 20 may comprise a substrate 28 onto which the MEMS microphone structure is mounted, wherein a spacer 26b may be arranged between the diaphragm structure 16 and the substrate 28. The substrate 28 may be, for example, a semiconductor material of a wafer out of which the MEMS microphone 20 is at least partially formed. Although embodiments described herein may relate to arrange one conductive layer, the first layer 32, according to other embodiments, further conductive layers may be arranged. The further layers may be electrically insulated from the first layer 32 or electrically connected thereto.

The counter electrode structure 14 may comprise a first layer 32 which may comprise, for example, a conductive semiconductor material and/or a metal material. The first layer 32 may be arranged between two insulating layers 34a and 34b. The insulating layers 34a and 34b may comprise an insulating material such as a nitride material and/or an oxide material for electrical insulation between the counter electrode structure 14, the first layer 32, respectively, and the diaphragm structure 16. At a side of the insulating layer 34a facing away from the first layer 32 a conductive structure forming the second element 22b may be arranged. The second element 22b may be insulated from the first layer 32 except for the contacting portion 24. An electric terminal 36 may be arranged at the insulating layer 34a so as to contact the first layer 32 through the insulating layer 34a. The contact and thus the electric terminal may allow for an electric contact with the first layer 32 at a main side surface of the counter electrode structure 14. For example, the main surface may be referred to as a top or bottom surface, wherein such terms may be understood non-limiting example. This may allow for a simplified electric connection when compared to a lateral connection of the first layer 32.

As described with respect to FIG. 1, the portion of the counter electrode structure comprising the contacting portion 24 may be referred to as the hot region 38. The region being spaced apart from the hot region 38 may be referred to as the cold region 42. At the cold region 42, a voltage U may be obtained between the second element 22b and the first layer 32 and/or the electric terminal 36.

Simplified, the first layer 32, i.e. at least a portion of the counter electrode structure 14, may be integral with the first element 22a of the thermocouple 18.

According to one example, the second element 22b comprises a metal material as a basis material, i.e. the second element 22b comprises mainly the metal material. The first element formed by the first layer 32 may comprise a semiconductor material. At the contacting portion 24 a so-called metal-to-semiconductor contact may be formed, for example, using a metal material and/or a doped semiconductor material.

As will be described in more detail with respect to FIGS. 3a and 3b the conductive structure of the second element 22b may be formed as a line-structure covering only parts of the insulating layer 34a. According to other embodiments, the second element 22b may be formed as a plate structure or a layer structure covering a portion of at least 25%, at least 50% or at least 75% of the insulating layer 34a.

FIG. 2b shows a schematic side view of a MEMS microphone 20'. When compared to the MEMS microphone 20, the thermocouple may be arranged at the diaphragm structure 16, wherein a first layer 32' of the diaphragm structure 16 is insulated from the second element 22b by an insulation layer 34c except for the contacting portion 24. Although FIGS. 2a and 2b illustrate the second element 22b as being arranged at a side of the counter electrode structure 14, the diaphragm structure 16 respectively at a side thereof facing away from the substrate 28, according to other embodiments the second element 22b may be arranged at a side of the counter electrode structure 14 or the diaphragm structure 16 facing the substrate 28.

FIG. 3a shows a schematic top view of a measuring structure 44 which may be arranged as counter electrode structure 14 and/or as the diaphragm structure 16 in MEMS microphones according to examples described herein. As the thermocouple may be arranged at the diaphragm structure and/or the counter electrode structure, the description provided applies to both configurations. By way of a non-limiting example only, the following description is made making reference to the measuring structure 44 being implemented as the counter electrode structure 14.

The measuring structure 44 may comprise a plurality of holes 46 allowing for an easy airflow into a volume or out of the volume between the diaphragm structure and the counter electrode structure during movement of the diaphragm structure. The holes 46 therefore enable a low mechanical resistance of air flow influencing the movement of the diaphragm structure caused by compression or decompression of air in the volume between both electrodes.

The measuring structure 44 may be segmented into a plurality of segments 48a-c as will be described in more detail with respect to FIG. 3b. The segments 48a-c are mechanically interconnected to each other, wherein the conductive material forming the first part of a respective thermocouple is insulated with respect to adjacent segments 48a-c. When referring again to FIG. 2a, the conductive material of the first layer 32 being arranged in segment 48b is electrically insulated with respect to the conductive material of the first layer 32 of segments 48a and 48c. Same applies to the conductive material of the first layer 32 being arranged in the segment 48c with reference to the conductive material of the first layer 32 being arranged at the segments 48a and 48b.

The measuring structure 44 may comprise two thermocouples which may be serially connected to each other, so as to form a thermopile. A thermopile may be understood as a structure comprising two or more thermocouples being interconnected to each other by a serial connection which may allow to increase an amplitude of a measurement signal, for example, a measurement voltage, which may allow for a higher precision of the measurement and therefore a higher precision when determining a temperature of the structure. In the segment 48b, a second segment 22b-1 of the first thermocouple may be arranged between the cold region 42 and the hot region 38. A second element 22b-2 of the second thermocouple may electrically interconnect the cold region 42 of the segment 48b and the hot region 38 of segment 48c, wherein the second element 22b-2 and the conductive material arranged in segment 48c may form the second thermocouple. As described in FIGS. 2a and 2b, the cold region 42 may be a region of the measurement structure 44 being arranged adjacent to the substrate 28 and may therefore be an anchored part 54 of the counter electrode structure 14 and/or of the diaphragm structure 16.

FIG. 3b shows a schematic side view of a cut A-A' being indicated, by non-limiting example only, in the upper-right corner of the measurement structure 44 illustrated in FIG. 3a. The segments 48a, 48b and 48c are separated from each other by a segmentation line 52 which will be described in more detail making reference to the cut line A-A'.

The segmentation line 52 may be obtained, for example, by removing or not arranging the conductive material of the first layer 32 in a region of the segmentation line 52 while leaving or arranging the insulating material of the insulating layer 34a and/or 34b in the region of the segmentation line 52. I.e., the segmentation line 52a may be configured to insulate the different parts of the backplate structure. Based on the presence of the insulating material and based on the absence of the conductive material, the segments 48a and 48b may be mechanically interconnected to each other while being electrically insulated with respect to each other and with respect to the conductive material of the first layer 32 (except for the contacting portion). As illustrated in FIG. 3a, an electrical connection between two segments may be obtained by arranging a second element of a thermocouple, for example the second element 22b-2. Based on the Seebeck coefficient of the second element 22b-2 being different from the Seebeck coefficient of the material of the first layer 32 an interconnection between the cold region of segment 48b with the hot region of segment 48c may be obtained enabling the serial interconnection of the thermocouples.

In other words, the hot region 38 may be arranged at a central area of the backplate (counter electrode structure). The contacting portions 24a and 24b may be implemented as openings in the nitride covering the first layer 32 for enabling a metal-poly Si (poly-silicon) contact. The elements 22b-1 and 22b-2 may be implemented as metal line. When referring to the cross-section of the segmentation illustrated in FIG. 3b, poly-silicon may be etched in order to have electrical insulation, while mechanical integrity may be obtained by remaining nitride layer(s).

Although FIG. 3a shows a measurement structure comprising two thermocouples, other examples may provide measurement structures providing one thermocouple or more than two thermocouples, for example three, four, five or more. Two or more thermocouples may be connected into series to obtain a thermopile. Alternatively, two or more thermocouples may be arranged parallel or separate to each other so as to provide a sensor array configured for measuring the temperature. A sensor array may be configured for measuring a plurality of temperature values related to a position of the respective thermocouples allowing for temperature imaging.

FIG. 4 shows a schematic side view of a MEMS microphone 40 being modified when compared to the MEMS microphone 20 illustrated in FIG. 2a. When compared to the MEMS microphone 20, the second element 22b may be formed by a doped semiconductor material to implement the conductive structure. For example, the first layer 32 may comprise an n-doped silicon material, wherein the second element 22b may comprise a p-doped silicon material for obtaining two different Seebeck coefficients. Alternatively, the first layer 32 may comprise a p-doped silicon material and the second element 22b may comprise an n-doped silicon material. Alternatively, the first layer 32 and the second element 22b may both comprise an n-doped silicon material or a p-doped silicon material with different levels of doping.

The first layer 32 and the second element 22b may be interconnected to each other at the contacting portion 24 by an optional via structure 55. The optional via structure 55 may be electrically conductive and may comprise, for example, a doped silicon material or a metal material. The via structure 55 comprising a metal material, for example, aluminum, gold or silver, may allow for avoiding having a diode-like structure at the contact between the first layer 32 and the second element 22b. When both the first layer 32 and the second element 22b are implemented so as to comprise a high doping level of silicon. The high level of doping concentration may be, for example, between 1017 cm-3 and 1021 cm-3 (or higher), between 1018 cm-3 and 5×1020 cm-3 and/or between 5×1018 cm-3 and 5×1019 cm-3. According to other examples, the high level of doping concentration may be larger than 1019 cm-3. The via structure 55 may be formed integral with the first layer 32 and/or the second element 22b and may allow for a direct contact between both elements of the thermocouple. Thus, in case of high doping levels of silicon, this may act like a metal and the two silicon layers 32 and 22b may be directly connected together instead of making a contact with a metal via.

The MEMS microphone 40 may comprise processor 56. The processor 56 may be configured to receive a measurement signal 58 from the thermocouple, i.e., a signal derived from a potential difference between the first layer 32 and the second element 22b in the cold region. The processor 56 may be configured to determine a temperature acting on the thermocouple using the measurement signal 58. The processor 56 may be connected to a memory having stored thereon values relating to a value of the measurement signal to a value of the temperature (lookup-table) and/or may execute a calculation rule for determining the temperature using the measurement signal.

FIG. 5 shows a schematic side view of a MEMS microphone 50 which may be used as a bolometer. The MEMS microphone 50 may comprise the substrate 28 and two movable diaphragms or membranes 16a and 16b. The MEMS microphone 50 may comprise the counter electrode structure 14 arranged between the membrane structures 16a and 16b. The counter electrode structure 14 may be spaced with respect to the membrane structures 16a and 16b by spacing structures 26a and 26b. The diaphragm structure 16b may be spaced with respect to the substrate 28 by a spacing structure 26c. The spacing structure 26a, 26b and/or 26c may comprise, for example, an oxide material and/or a nitride material. Between the first layer 32 and the second element 22b an insulating layer 26d may be arranged, which may be formed as a spacing layer and/or as an insulating layer as is described with respect to the layers 34a and/or 34b. The first layer 32 and the second element 22b may be formed by two different poly-silicon layers as was described with respect to FIG. 4. The first layer 32 and the second element 22b may comprise different work functions (potential generated over temperature variance) and/or different Seebeck coefficients. The structure presented may allow for an absorption of infrared (IR) radiation by the first layer 32 and/or the second element 22b. The absorption may allow for a heating the absorption region and therefore for heating the structure. Alternatively or in addition, infrared radiation may be absorbed by the spacing layer 26, which may also act as a dielectric layer, and/or a material in contact with the hot junction in the hot region, for example, the via structure 54.

The diaphragm structures 16a and 16b may be mechanically interconnected, for example, by one or more pillar structures. This allows for an essentially constant distance between the diaphragm structures 16a and 16b. A volume between the diaphragm structures 16a and 16b may be a low pressure region. For example, a cavity between the diaphragm structures 16a and 16b may be a sealed cavity allowing for a pressure in the volume 64 that is different from an ambient pressure. For example, the pressure in the volume 64 or low pressure region may be less than 50% of the ambient pressure, less than 40% of the ambient pressure or less than 20% of the ambient pressure. For example, a pressure in the volume 64 may essentially be a vacuum. A low pressure or a vacuum in the volume 64 may allow to prevent a heat dissipation from the first layer 32 and/or the second element 22b due to a low amount of air particles and/or a prevented air flow in the volume 64. The pillar structures 62 may allow for obtaining and maintaining a distance between the diaphragm structures 16a and 16b in the presence of the low pressure region in the volume 64.

The diaphragm structures 16a and/or 16b may be at least partially transparent to an infrared radiation which may also be referred to as thermal radiation. A transparency of the diaphragm structures 16a and 16b to thermal radiation may allow for a high sensitivity of the measurement as temperature in an environment of the MEMS microphone 50 may be sensed by the thermal radiation which travels through the diaphragm structures to the thermocouple.

The MEMS microphone 50 may comprise a temperature sensor 66. The temperature sensor 66 may be configured for sensing a temperature of a system to which the MEMS microphone 50 is mounted and/or a temperature of other parts of the MEMS microphone 50 such as an ASIC. For example, the MEMS microphone 50 may be mounted to a mobile system such as a computer, a mobile phone, a tablet computer or the like. An application of the MEMS microphone 50 may be to sense or determine a temperature of an environment of the respective system. For obtaining a high precision of such a measurement, the measurement from the thermopile of the MEMS microphone 50 may be calibrated or corrected by values of the temperature sensor 66, i.e. a temperature of the system itself may be incorporated into the measurement.

According to other embodiments, different MEMS microphones, for example the MEMS microphone 10, 20, 20' or 40 may comprise the temperature sensor 66 and/or the processor 56.

FIG. 6 shows a schematic side view of a MEMS microphone 60 in accordance with embodiments described herein. The diaphragm structures 16a and 16b may be interconnected to each other by a plurality of pillar structures 62a and 62b as described with respect to FIG. 5. The conductive first layer 32 may be used as a counter electrode for the diaphragm structure 16b. The second element 22b may be used as a counter electrode for the diaphragm structure 16a. The diaphragm structures 16a and 16b may enclose the cavity or volume 64 which may comprise the low pressure region, a vacuum, respectively. This may allow for the thermocouple being arranged in a vacuum or vacuum-like pressure so as to allow for a more precise measurement as a heat transfer from the hot area to the cold area due to air or air flow may be prevented or at least reduced. According to one embodiment which may also be referred to as a preferred embodiment, the first layer 32 may be connected to the second element 22b in a central area, as illustrated in FIG. 5. Preferably, the first layer 32 and the second element 22b may comprise silicon and may either be highly doped or have a similar doping type with different levels. This enables a connection between the first layer 32 and the second element 22b without generating a relevant p-n junction.

The MEMS microphone 60 may comprise a ventilation hole 68 which may allow for a pressure compensation between both sides of the movable structures 16a and 16b, as described with respect to the holes 46 in FIG. 3a. The ventilation hole may be understood as channel through the structure, wherein the channel may keep the low-pressure region isolated from an ambient pressure.

FIG. 7a shows a schematic top view of a measuring structure 44' which may be part of a MEMS microphone in accordance with embodiments described herein. The measuring structure 44' comprises segmentation lines 52a and 52b so as to segment the conductive basis material of the measuring structure 44' into segments 48a, 48b and 48c, wherein the segment 48c is arranged between the segments 48a and 48b. As described in connection with FIG. 3a, the segments may relate to a segmentation of the conductive basis material of the counter electrode structure or to a segmentation of the basis material of the diaphragm structure. A first thermocouple may be arranged at the segment 48a, wherein a segment thermocouple may be arranged at the segment 48b. A voltage or current source 72 may be connected to the segment 48c and may be configured to apply a current and/or a voltage to the conductive basis material of the segment 48c of the counter electrode structure or the diaphragm structure. The current or the voltage may allow for heating the segment 48c such that the segment 48c may be described as a heater or a heating element arranged between the thermocouples 18a and 18b.

As described in connection with other embodiments herein, for example in connection with the MEMS microphone 20, the basis material of the counter electrode segment, of the diaphragm segment respectively, may at least partially form a part of the first and/or second thermocouple. The processor 56 may be configured for receiving measurement signals from the thermocouples 18a and 18b. As an option, processor 56 may be configured to control the voltage or current source 72 via a control signal 74. The processor 56 may have knowledge about an achieved amount of heating of the heating element arranged at the segment 48c. By evaluating the measurement signals of thermocouples 18a and 18b, the processor 56 may be configured to determine information related to a heat dissipation from the heater, the segment 48c respectively, to the thermocouples 18a and 18b. The processor 56 may be configured to compare the measurement signals of both thermocouples 18 and 18b and to derive an information relating to an air flow and/or a humidity adjacent to the MEMS microphone from the information related to the heat dissipation from the heater element to the first thermocouple 18a and to the second thermocouple 18b. When explaining functionality relating to the air flow, such aspects may apply also for humidity as both, the air flow and the humidity influence a heat dissipation. For example, the processor 56 may be configured for determining that the temperature at the thermocouple 18a is different from a temperature at the thermocouple 18b. For example, a higher temperature at one of the thermocouples may indicate a leeward side with respect to the thermocouple comprising a lower temperature which may be identified as being at a windward position. The heater may be connected to the heated element or spaced apart from that. For the functionality of relating a heat dissipation it may be sufficient to use an information about an amount of heat (energy) arriving at the element.

In other words, the backplate may be equipped with a heater and thermocouples may be used to measure the heat transfer from the heater to the thermocouples. The heat transfer from the heater at the segment 48c to the thermocouples 18a and 18b may be influenced by humidity or air flux of ambient air volume. In case of an air flux, the MEMS microphone comprising the temperature sensor (thermocouples) may be used as an anemometer. For implementing the heating element the conductive material of the diaphragm structure or the counter electrode structure may be used. Alternatively, a high resistive path through which the current of the voltage or current source 72 flows may be used as a heating element. The heating element implemented by a high resistive path may be arranged at the segment 48c. In FIG. 7a, the high resistive path may be, for example, a portion of the segment 48c comprising a portion 49. The portion 49 may comprise a smaller dimension when compared to other portions of the segment allowing for an increased electric resistance and thus for a generation of heat when an electric current is applied. The electric current may travel between the outer regions of segment 48c and may pass the portion 49. The smaller dimension may be, for example, a reduced lateral extension, for example, along a lateral direction 51 of a main surface of the measuring structure 44' and/or a direction perpendicular to the lateral direction 51, e.g., a thickness direction. According to other embodiments, a resistive element configured to generate heat may be arranged at the measuring surface. The thermopile temperature sensor may be used to measure the cooling rate which depends on the air flow. The high resistive path (portion 49) may generate a high level of heat when compared to the outer regions of segment 49 and may be preferentially located close to the thermocouples. The outer regions may be large, which may allow for a lower resistance and less heat generation. The central part (portion 49) may be narrow, which means high resistance and high heat generation.

FIG. 7b shows a schematic side view of a MEMS microphone 70 in accordance with embodiments described herein. The MEMS microphone 70 may comprise the measuring structure 44, for example implementing the counter electrode structure, a diaphragm structure and the substrate 28 and may essentially be built as described in connection with MEMS microphones 10, 20, 20', 40, 50 or 60. The MEMS microphone 70 may be arranged at a printed circuit board (PCB). Adjacent thereto an application specific integrated circuit (ASIC) may be arranged, for example, at the PCB. The ASIC 78 may be configured for evaluating an output signal of the MEMS microphone structure. For example, the ASIC 78 may be at least a part of the processor 56. The MEMS microphone 70 may comprise a housing 82, wherein an opening 84 of the housing may be adjacent to the measuring structure 44'. The MEMS microphone 70 may be configured to determine the information related to the heat dissipation from the heater element to the first and second thermocouple as described in connection with FIG. 7a. In other words, FIG. 7b illustrates a MEMS microphone in a top port configuration, i.e. a sound port is on top of the MEMS microphone.

FIG. 7c shows a schematic top view of a measuring structure 44" which may be arranged at MEMS microphones in accordance with embodiments described herein. The measuring structure 44" comprises segmentation lines 52a-d to define four segments 48a-d which are essentially quadrants of the measuring structure 44". At each of the quadrants 48a-d one or more thermocouples 18a-d is arranged. Between two adjacent segments 48a-d spacing segments 48e and/or 48f are arranged. At the spacing segments 48a and 48f heating elements 88a-d are arranged which are configured to heat the segments 48e and 48f. The heaters 88a-d may be understood as heat providing elements, e.g., implemented as conductive paths providing an electric resistance allowing for converting electric current into thermal energy. Such a resistive path for heater a heater 88a-d may be narrow at a lateral dimension when compared to an axial extension. The heaters may be arranged adjacent to one or more segments 48a-d. One or more heaters 88a-d may be formed integral with each other such as, by non-limiting example only, the heaters 88a and 88c, the heaters 88b and 88d and/or the heaters 88a-d. According to other embodiments described herein, one or more heaters may be arranged adjacent to the segments but spaced apart therefrom.

The processor 46 illustrated in FIG. 7a may be configured to receive the measurement signals from each of the thermocouples 18a-d. Using the measurement signals from the thermocouples 18a-d, the processor may be configured to determine the information related to the heat dissipation from one or more of the heater elements to the thermocouples 18a-d. The processor may be further configured to derive a direction and/or an intensity of air flow adjacent to the MEMS microphone, for example, the air flow 86, from the information related to the heat dissipation from the heater element to the four thermocouples. The air flow 86 may thus be an air flow that cools the MEMS. Simplified, the four thermocouples 18*a-d* provide for a two-dimensional field in which heat dissipation may be measured. In other words, the backplate may include four quadrants. Each of them may include a heater and a temperature sensor in order to be able to deduce the direction of air flow which cools the backplate in an anisotropic way.

Although in previous embodiments different thermocouples are described as being arranged at different segments of a counter electrode structure or a diaphragm structure, two or more thermocouples may be arranged at a same segment. The two or more thermocouples may be connected to each other so as to form a thermopile. According to another embodiment, the different thermocouples may be evaluated individually, i.e. different thermocouples may form a sensor array, which may be understood as parallel connection between the thermocouples and/or evaluation of a measurement signal from each of the thermocouples. According to other embodiments a plurality of thermocouples as for example illustrated in FIG. 7*c* may be used as sensor array, i.e. the thermocouples 18*b-d* may form a sensor array with the thermocouple 18*a*. This may allow for implementing a functionality of a bolometer and/or of an IR imaging, i.e. each thermocouple may provide information relating to a picture element or a picture region of a thermal picture.

FIG. 8 shows a schematic side view of an apparatus 80. The apparatus 80 comprises, for example, the MEMS microphone 50 and a housing 92, wherein the MEMS microphone 50 is arranged inside the housing 92. The MEMS microphone structure of the MEMS microphone 50 may be connected to an outer volume 94 of the apparatus 80 through a sound port 96, i.e. an opening in the housing 92 configured to enable a travel of sound waves from the outer volume 94 to the MEMS microphone 50 and/or vice versa. Apparatus 80 may be, for example, a mobile device such as a mobile phone, a mobile computer and/or a table computer. According to other embodiments, apparatus 80 may comprise as an alternative or in addition another MEMS microphone in accordance with embodiments described herein, for example, the MEMS microphone 10, 20, 20', 40, or 60.

The processor 56 may be configured to receive the measurement signal from the thermocouple and to relate the received measurement signal to a temperature of an object 98 outside the housing, i.e. external to the housing 92. The temperature of the object 98 may act on the thermocouple through the sound port 96. For example, the object 98 may comprise a higher temperature when compared to a temperature of the apparatus 80. By non-limiting example only, this may be referred to as $T_{hot}$. The temperature of the object 98 may influence a temperature of the MEMS microphone structure, for example, based on thermal radiation or infrared radiation. This may lead to a temperature T1 at a region of the MEMS microphone structure 12. Adjacent parts of the MEMS microphone 50 or other regions of the apparatus 30 may comprise a different temperature which may also be referred to as ambient temperature and which is indicated by $T_0$. This temperature $T_0$ may be measured by processor 56, for example, using the temperature sensor 66. The measurement signal 58 may thus depend on temperature $T_{hot}$, $T_1$ and $T_0$. Simplified, this may be indicated as measurement signal $58 = V \sim T_1 - T_0 \sim$. By knowledge of the ambient temperature $T_0$, the processor 56 may calibrate or correct the measurement signal 58 by correcting it in view of the influence of the ambient temperature $T_0$ on the measurement signal 58.

Thus, a processor of apparatus 80 may be configured to receive a measurement signal from the thermocouple and to relate the received measurement signal to a temperature of the object 98 external to the housing 92. The temperature may act on the thermocouple 18 through the sound port 96.

The apparatus 80 may comprise a temperature sensor configured for sensing a temperature inside the housing. A processor of the apparatus 80, for example the ASIC 78 or a further processor, may be configured to receive the measurement signal from the thermocouple and to receive information related to the temperature inside the housing 92. The processor may be configured to determine a temperature outside the housing using the measurement signal from the thermocouple and using the information related to the temperature inside the housing 92.

In other words, FIG. 8 shows an alternative embodiment with vacuum microphone couples. Such an apparatus may serve as an infrared bolometer to measure the infrared radiation absorbed in the thermocouple hot junctions. The apparatus may be used to measure temperature of the object 98 remotely.

FIG. 9 shows a schematic side view of a section of apparatus 80 comprising the housing 92, wherein the apparatus 80 comprises the MEMS microphone 10 and the ASIC 78 connected to the MEMS microphone 10. The MEMS microphone 10 may be connected to the outer volume 94 via the sound board 96. The MEMS microphone 10 and the ASIC 78 may be enclosed by a common package, i.e. housing, 93.

In other words, apparatus 80 may be configured to perform temperature measurement of the environment with a sensor located in the same die or package as a microphone. Apparatus 80 solves the task to overcome an incorrectness of measurement resulting when sensing the temperature of the microphone or ASIC die, a temperature of the system in which the microphone is integrated is measured and not the temperature of the environment. If the thermocouple would be arranged at the ASIC 78, for example, then the temperature of the environment would be highly influenced by the temperature inside the housing 92. By combining the diaphragm structure and/or the counter electrode structure with a thermopile as described by examples herein, the thermopile is highly influenced by the temperature of the outer volume 94, which allows for correcting the obtained measurement by the temperature inside the housing 92 and thus to obtain correct measurement values.

Figure 10B:
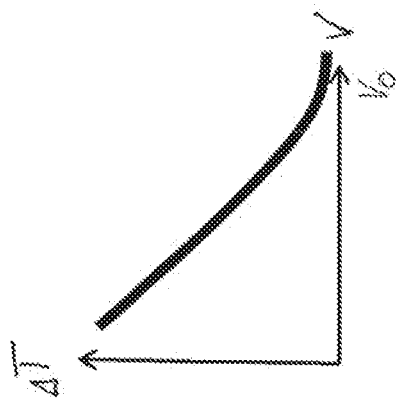
FIG. 10b illustrates a function graph between a temperature difference on the thermocouple dependent on a speed of an air flow adjacent to the apparatus, according to an embodiment.
Figure 10A:
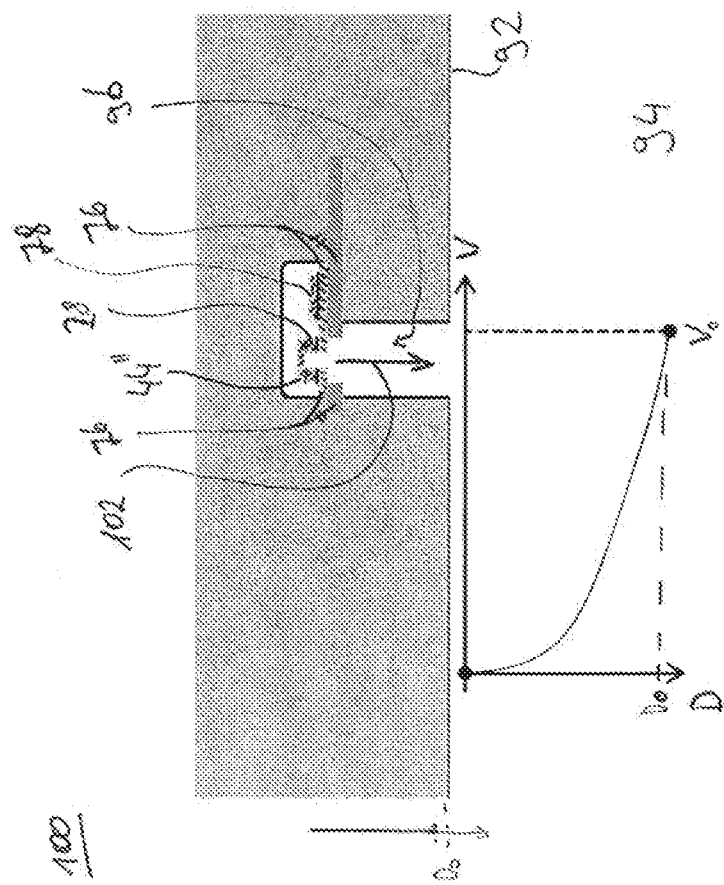
FIG. 10a shows a schematic side view of another apparatus in accordance with embodiments described herein.

FIG. 10*a* shows a schematic side view of an apparatus 100. When describing apparatus 100 reference is made to FIG. 4 and to FIG. 7*c*. Apparatus 100 may comprise a MEMS microphone comprising a configuration based on the MEMS microphone 40. The position of the counter electrode structure may be alternated so that the counter electrode portion comprising the first layer 32, the second element 22*b* and the insulating layers 34*a* and/or 34*b* is arranged between the diaphragm structure 16 and the substrate 28. This may also be referred to as a MEMS microphone comprising a bottom backplate configuration. According to another embodiment, such a second counter electrode structure may be arranged between the diaphragm structure 16 and the substrate 28 in addition to the counter electrode structure 32 to obtain a so-called dual backplate microphone, i.e. the diaphragm structure 16 is arranged between two backplate counter electrode structures. It may be sufficient that the thermocouple is arranged at one of both counter electrode structures. For example, the thermocouple may be implemented on the counter electrode structure being arranged between the diaphragm structure 16 and the substrate 28. By non-limiting example only, the apparatus 100 may be described as having a so-called bottom port configuration, i.e. when holding the apparatus 100 during normal operation, the sound port 94 may be arranged at a bottom of apparatus 100. For example, when apparatus 100 is a mobile phone, the microphone usually is at a bottom region of the apparatus near to a mouth of a speaker using the phone. According to other examples, the sound port 96 may be on a top region of the apparatus 100. In either case, the thermocouple may be arranged at a counter electrode structure facing an opening of the apparatus 100 and/or may be covered by the diaphragm structure.

The air flow 86 flowing along the system housing, i.e. along the housing 92 of apparatus 100 may change a heat transfer 102, wherein the change may be proportional to a speed V of the air flow 86, i.e. a wind speed. A function graph illustrated in FIG. 10a illustrates a dependency of the heat transfer 102 based on a distance D between the measuring structure 44" and the outer volume 94 and the velocity V of the air flow 86. A velocity 86 $V_0$ to be measured may relate to a distance $D_0$ at the border of the housing 92.

FIG. 10b illustrates a function graph between a temperature difference ΔT on the thermocouple, e.g., when applying a constant heat power, dependent on the speed v of a fluidic flow adjacent to the housing 92 adjacent to the sound port 96. The higher the speed v is, the lower the temperature difference ΔT may be. For example, when a fluidic flow, e.g., an air flow, occurs outside the housing 92, the following may apply in case of a laminar air flow: A heat loss versus a temperature difference ΔT of the heating element versus an ambient temperature may be described as:

$$\Delta T = T_{sens} - T_{ambient}$$

wherein $T_{sens}$ refers to a temperature obtained by heating the measuring structure 44" with a heating element and wherein $T_{ambient}$ may refer to a temperature measured by a further temperature sensor.

A steady state heat loss may be referred to as $G_0$. A power dissipation of heat energy may be expressed as $$P = (G_0 + \text{Sensitivity} * \sqrt{v}) * \Delta T$$

wherein v is a velocity of the fluidic flow. As $G_0$, the sensitivity and the power dissipation may be known, calibrated and/or measured, ΔT and thus $T_{ambient}$ may be determined.

In other words, air flowing along the system housing may change the heat transfer 102 proportional to the wind speed, which may be determined by a processor such as the processor 56, as the processor might use knowledge of the distance between the thermocouple and the housing and might use knowledge of a heat transferred to the thermocouple to determine a velocity of the air flow by measuring the temperature difference.

In known systems, it is very difficult to sense the temperature of the environment by sensing the temperature of the MEMS or ASIC dies, as there is no air flow from outside to the cavity of the chips. Some examples described herein are configured to sense a temperature by measuring light, in particular IR radiation illuminated by objects outside the system, wherein the IR radiation may travel through the sound port to the thermocouple. Other examples may relate to expose a thermocouple to the temperature to be sensed or at least having structures between the thermocouple and an outer environment that falsify the measurement in a low amount.

FIG. 11 shows the configuration of a thermopile 104 being arranged at the diaphragm structure 16. The counter electrode structure 14 may be arranged between the substrate and the diaphragm structure 16 and/or at a side of the diaphragm structure 16 facing away from the substrate or from the spacing structure 26.

The first elements and the second elements are interconnected to each other at contacting portions which is arranged at the hot region 38. At an opposing end of the first element 22a of a first outer thermocouple 18a and the second element 22b of a second outer thermocouple 18a the measurement voltage U may be obtained between both elements 22a and 22b, for example, at the cold region 42. Both elements 22a and 22b may comprise different materials so as to obtain different Seebeck coefficients. Based on the serial connection, the elements 22a and 22b mal also comprise same Seebeck coefficients, wherein a first element and a second element of each thermocouple 18a-e may comprise a Seebeck coefficient being pairwise different from each other.

The thermopile 104 is arranged at the counter electrode structure 14. The thermopile 104 may comprise two or more, for example five, thermocouples 18a-e which are serially connected to each other so as to obtain a higher measurement voltage indicated as VS. The measurement voltage VS may be five times the voltage being generated by one of the thermocouples 18a-e. Each single voltage may be influenced by a coefficient αAB relating to the difference of the Seebeck coefficients of the materials of the respective first element and second element and may be influenced by the temperature difference ΔT between the hot region 38 and the cold region 42. The hot region 38 may be located at or near to an absorption area 106 arranged at the counter electrode structure 14 or formed integrally therewith. The absorption area 106 may be configured to absorb infrared radiation, thermal radiation respectively, and to convert the radiation into heat to obtain a different temperature when compared to the cold region 42.

In other words, the thermopile 104 may comprise five series-connected thermocouples. The thermopile can be used as an infrared detector if the thermocouples are placed on a suspended and thermally insulating dielectric layer and if an absorber layer or absorption area is placed close to the hot contacts of the thermopile. The thermopile 104 may be used as an infrared detector. Thermocouples may be placed on the diaphragm structure and/or the counter electrode structure. An absorber layer or an absorption area 106 may be arranged on the respective structure next to the hot junction. Thus, a thermocouple may be arranged and used between a hot region (which may include a material that absorbs infrared light) and a cold region (which may include an absence of such an absorption area and/or which may be located so as to not be exposed to infrared light or to be exposed to the infrared light with a lower degree from outside the apparatus and/or which may be located on a heat sink, like bulk silicon or substrate). A difference of temperature between the hot region and the cold region due to infrared absorption may create a voltage variation which may be measured and evaluated by a processor.

One aspect of embodiments described herein is to use the backplate of a silicon microphone to build an infrared temperature sensor. A capacitive silicon microphone may be made of a flexible membrane on top of a cavity. This membrane may be conductive and may preferably be made of silicon and/or poly-silicon. On top, below, or both a backplate may be arranged, i.e. a counter electrode structure, which may be a rigid membrane. It may be made of layers of silicon and/or poly-silicon and silicon nitride, to induce a tensile stress and to increase stiffness.

Membrane (diaphragm structure) and backplate (counter electrode structure) may form a variable capacitor which may be read-out by an ASIC. Thus, a MEMS microphone may comprise a movable electrode, a rigid electrode used to capacitively measure the motion of the moveable electrode induced by sound, wherein the rigid electrode may be made of a first conductive material, an insulating layer on top of the first conductive material and a second conductive material with a different Seebeck coefficient when compared to the first conductive material. The two conductive materials may form a thermocouple and may be connected together in a central region of the rigid electrode and a voltage difference between the first and the second material may be measured at an anchored part of the rigid electrode.

The rigid electrode may be made of silicon and/or poly-silicon, which is the material that may be used for backplates in capacitive MEMS microphones. Such a silicon layer may be used as the first thermopile material. A silicon nitride or silicon oxide layer on top of the silicon layer may be used for electrical insulation. Nitride may be preferred as it is used on most backplates of MEMS microphones in order to rigidify them.

A metal layer or conductive semiconductor material layer on top of the insulating layer may be used as the second thermopile material. Lines of metal material or doped semiconductor material may be used on top of nitride of the backplate structure.

Openings of the nitride layer can enable a contact between poly-silicon and metal or the doped poly-silicon material. Hot regions may be located in the central area of the microphone membrane and of the backplate. The cold region may be located at the border of the membrane and may preferably be a part with bulk silicon below or on top, i.e. adjacent thereto, acting as a heat sink.

When the backplate is formed on top of the membrane, i.e. spaced apart from the sound port by the diaphragm structure, the temperature sensing may be less sensitive as the infrared radiation may have to travel through the membrane structure. However, the membrane structure may be formed to be quite thin, so that the membrane absorption is not total. Although comprising a reduced sensitivity, such a configuration may be easier to fabricate.

Alternatively, the sensor can be built on a membrane separated from the microphone but next to it. I.e., the membrane may be separated from the microphone and may be fabricated by the same technological process as for the backplate. The membrane structures may have access to the sound port so that the infrared radiation may reach the separated membrane.

A temperature sensor may be added on or next to the ASIC which may process the data in order to correct the measurement from the temperature of the system in which the microphone is included. This may apply for a temperature that the ASIC will sense.

FIG. 12 illustrates a schematic arrangement of a further temperature sensor according to an embodiment. A MEMS microphone 120 may comprise the MEMS microphone 20. According to other embodiments a further and/or different MEMS microphone according to embodiments described herein may be arranged, for example, the MEMS microphone 10, 20, 20', 40, 50, 60 or 70. Adjacent to the MEMS microphone 20 may be arranged adjacent to a temperature sensor 122. The temperature sensor 122 may comprise a first layer 32b and a second element 22b-2 being separated from each other except for an electric contact in a contacting portion 24b. This may allow, in simple terms, for a functionality of a temperature sensor as described, for example, with respect to FIG. 2a, in absence of a microphone functionality. The temperature sensor may comprise a diaphragm structure and a thermocouple being arranged at the membrane structure. According to other examples, the temperature sensor 122 may comprise a counter electrode structure and may be operated as a microphone. The temperature 122 sensor may be arranged adjacent to the MEMS microphone 20. Adjacent may relate to a low distance such as an arrangement of both, the MEMS microphone 20 and the temperature sensor 122 in a common package or on a common PCB.

FIG. 13 shows a schematic flow chart of a method 1300 for fabricating a MEMS microphone. The method 1300 comprises a step 1310 in which a MEMS microphone structure having a counter electrode and a diaphragm structure deflectable with respect to the counter electrode structure is provided. The method 1300 comprises a step 1320 in which a thermocouple is formed at the MEMS microphone structure.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

In some embodiments, a programmable logic device (for example a field programmable gate array) may be used to perform some or all of the functionalities of the methods described herein. In particular, processors described herein may be realized by a programmable logic device. In some embodiments, a field programmable gate array may cooperate with a microprocessor in order to perform one of the methods described herein. According to other embodiments, a processor described herein may be at least partially implemented by a microprocessor and/or may comprise both, a programmable logic device and a microprocessor. Generally, the methods are preferably performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A MEMS microphone comprising:
   a MEMS microphone structure having at least one backplate and a diaphragm structure deflectable with respect to the backplate;
   a first thermocouple arranged at the backplate: and
   a second thermocouple,
   wherein the backplate comprises a conductive basis material segmented to form at least a first counter electrode segment and a second counter electrode segment separated from each other by a segmentation line,
wherein the first thermocouple is arranged at the first counter electrode segment, and
wherein the second thermocouple is arranged at the second counter electrode segment.

2. The MEMS microphone in accordance with claim 1, further comprising an ASIC for evaluating an output signal of the MEMS microphone structure.

3. The MEMS microphone in accordance with claim 1, wherein the first thermocouple comprises a first element comprising a first Seebeck coefficient, a second element comprising a second Seebeck coefficient and an insulating layer arranged between the first element and the second element, and wherein the first element and the second element are electrically connected to each other via the insulating layer at a contacting portion.

4. The MEMS microphone in accordance with claim 3, wherein the second element comprises one of a metal material or a doped semiconductor material.

5. The MEMS microphone in accordance with claim 3, wherein the first element comprises a doped semiconductor material of a first type, wherein the second element comprises a doped semiconductor material of a second type, and wherein the first type provides for the first Seebeck coefficient, and wherein the second type provides for the second Seebeck coefficient.

6. The MEMS microphone in accordance with claim 3, wherein the first element and the second element comprise a semiconductor material and are electrically interconnected to each other by a via structure comprising a metal material.

7. The MEMS microphone in accordance with claim 1, wherein the diaphragm structure is a membrane of the MEMS microphone.

8. The MEMS microphone in accordance with claim 1, further comprising a processor configured to receive a measurement signal from the first thermocouple and being configured to determine a temperature acting on the first thermocouple using the measurement signal of the first thermocouple.

9. The MEMS microphone in accordance with claim 1, wherein the conductive basis material of the backplate at least partially forms a first element of the first thermocouple, and wherein a conductive structure connected to the backplate at least partially forms a second element of the first thermocouple.

10. The MEMS microphone in accordance with claim 1, wherein the basis material of the first counter electrode segment is part of the first thermocouple, and wherein the basis material of the second counter electrode segment is part of the second thermocouple.

11. The MEMS microphone in accordance with claim 1, wherein the first thermocouple is serially connected to the second thermocouple, so as to form a thermopile.

12. The MEMS microphone in accordance with claim 1, further comprising a processor configured to determine information related to a heat dissipation from a heater element to the first and second thermocouples, the heater element being arranged between the first thermocouple and the second thermocouple, and wherein the processor is configured to derive an air flow adjacent to the MEMS microphone from the information related to the heat dissipation from the heater element to the first thermocouple and to the second thermocouple.

13. The MEMS microphone in accordance with claim 1, further comprising a processor configured to determine information related to a heat dissipation from a heater element to at least four thermocouples, wherein at the at least four thermocouples are arranged at four segments of the backplate, and wherein the processor is configured to derive a direction and/or an intensity of air flow adjacent to the MEMS microphone from the information related to the heat dissipation from the heater element to the four thermocouples.

14. The MEMS microphone in accordance with claim 1, further comprising a second temperature sensor configured for sensing a temperature of a system to which the MEMS microphone is mounted.

15. The MEMS microphone in accordance with claim 14, wherein the second temperature sensor comprises a second diaphragm structure and a second thermocouple arranged at the second diaphragm structure.

16. The MEMS microphone in accordance with claim 1, wherein the diaphragm structure is a first diaphragm structure, wherein the MEMS microphone structure comprises a second diaphragm structure spaced apart from the first diaphragm structure, and a low pressure region disposed between the first diaphragm structure and the second diaphragm structure, the low pressure region having a pressure less than an ambient pressure, and wherein the backplate is disposed within the low pressure region.

17. The MEMS microphone in accordance with claim 1, wherein the diaphragm structure is at least partially transparent to thermal radiation.

18. The MEMS microphone in accordance with claim 1, wherein the first thermocouple and the second thermocouple form a sensor array.

19. A MEMS microphone comprising:
a MEMS microphone structure having at least one counter electrode structure, a first diaphragm structure deflectable with respect to the counter electrode structure, a second diaphragm structure spaced apart from the first diaphragm structure, a low pressure region disposed between the first diaphragm structure and the second diaphragm structure, the low pressure region having a pressure less than an ambient pressure, wherein the counter electrode structure is disposed within the low pressure region; and
a thermocouple arranged at the MEMS microphone structure.

20. A MEMS microphone comprising:
a MEMS microphone structure having at least one counter electrode structure and a diaphragm structure deflectable with respect to the counter electrode structure;
a first thermocouple arranged at the diaphragm structure: and
a second thermocouple,
wherein the diaphragm structure comprises a conductive basis material segmented to form at least a first diaphragm segment and a second diaphragm segment separated from each other by a segmentation line,
wherein the first thermocouple is arranged at the first diaphragm segment, and
wherein the second thermocouple is arranged at the second diaphragm segment.

21. The MEMS microphone in accordance with claim 20, wherein the basis material of the first diaphragm segment is part of the first thermocouple, and wherein the basis material of the second diaphragm segment is part of the second thermocouple.

22. The MEMS microphone in accordance with claim 20, wherein the first thermocouple is serially connected to the second thermocouple, so as to form a thermopile.

23. The MEMS microphone in accordance with claim 20, further comprising a processor configured to determine information related to a heat dissipation from a heater element to the first thermocouple and to the second thermocouple, the heater element being arranged between the first thermocouple and the second thermocouple, wherein the processor is configured to derive an air flow adjacent to the MEMS microphone from the information related to the heat dissipation from the heater element to the first thermocouple and to the second thermocouple.

24. A MEMS microphone comprising:
a MEMS microphone structure having at least one backplate and a diaphragm structure deflectable with respect to the backplate; and
a thermocouple arranged at the backplate and the diaphragm structure,
wherein the thermocouple is a first thermocouple, wherein the diaphragm structure comprises a conductive basis material segmented to form at least a first diaphragm segment and a second diaphragm segment separated from each other by a segmentation line, wherein the first thermocouple is arranged at the first diaphragm segment, and wherein a second thermocouple is arranged at the second diaphragm segment.

25. The MEMS microphone in accordance with claim 24, wherein the conductive basis material of the diaphragm structure at least partially forms a first element of the thermocouple, and wherein a conductive structure connected to the diaphragm structure at least partially forms a second element of the thermocouple.

26. The MEMS microphone in accordance with claim 24, wherein the basis material of the first diaphragm segment is part of the first thermocouple, and wherein the basis material of the second diaphragm segment is part of the second thermocouple.

27. The MEMS microphone in accordance with claim 24, wherein the first thermocouple is serially connected to the second thermocouple, so as to form a thermopile.

28. The MEMS microphone in accordance with claim 24, further comprising a processor configured to determine information related to a heat dissipation from a heater element to the first thermocouple and to the second thermocouple, the heater element being arranged between the first thermocouple and the second thermocouple, wherein the processor is configured to derive an air flow adjacent to the MEMS microphone from the information related to the heat dissipation from the heater element to the first thermocouple and to the second thermocouple.

29. The MEMS microphone in accordance with claim 24, further comprising a processor configured to determine information related to a heat dissipation from a heater element to at least four thermocouples, wherein the at least four thermocouples are arranged at four segments of the diaphragm structure, and wherein the processor is configured to derive a direction and/or an intensity of air flow adjacent to the MEMS microphone from the information related to the heat dissipation from the heater element to the four thermocouples.

30. The MEMS microphone in accordance with claim 19, wherein the low pressure region is a sealed cavity.

31. The MEMS microphone in accordance with claim 19, wherein the pressure in the low pressure region is less than 50 % of the ambient pressure.

32. The MEMS microphone in accordance with claim 19, further comprising one or more pillars coupled between the first diaphragm structure and the second diaphragm structure.

* * * * *